United States Patent
Sato

(10) Patent No.: US 6,852,468 B2
(45) Date of Patent: Feb. 8, 2005

(54) POSITIVE RESIST COMPOSITION

(75) Inventor: Kenichiro Sato, Shizuoka (JP)

(73) Assignee: Fuji Photo Film Co., Ltd., Kanagawa (JP)

(*) Notice: Subject to any disclaimer, the term of this patent is extended or adjusted under 35 U.S.C. 154(b) by 0 days.

(21) Appl. No.: 10/165,976

(22) Filed: Jun. 11, 2002

(65) Prior Publication Data
US 2003/0077543 A1 Apr. 24, 2003

(30) Foreign Application Priority Data

Jun. 12, 2001 (JP) .................................. P.2001-177158
Oct. 4, 2001 (JP) .................................. P.2001-308717

(51) Int. Cl.$^7$ ............................................. G03F 7/039
(52) U.S. Cl. .................................................. 430/270.1
(58) Field of Search ...................................... 430/270.1

(56) References Cited

U.S. PATENT DOCUMENTS

| | | | |
|---|---|---|---|
| 6,440,636 B1 * | 8/2002 | Ushirogouchi et al. | 430/270.1 |
| 6,479,211 B1 * | 11/2002 | Sato et al. | 430/270.1 |
| 2001/0014428 A1 * | 8/2001 | Uetani et al. | 430/270.1 |
| 2001/0026901 A1 * | 10/2001 | Maeda et al. | 430/270.1 |
| 2002/0155383 A1 | 10/2002 | Fujimori et al. | |
| 2003/0008241 A1 | 1/2003 | Sato et al. | |
| 2003/0017415 A1 * | 1/2003 | Kodama et al. | 430/287.1 |
| 2003/0054286 A1 * | 3/2003 | Sato et al. | 430/270.1 |
| 2003/0077540 A1 * | 4/2003 | Kodama et al. | 430/270.1 |

FOREIGN PATENT DOCUMENTS

| | | | |
|---|---|---|---|
| EP | 1 172 384 A1 | | 1/2002 |
| EP | 1 172 694 A1 | | 1/2002 |
| EP | 1 179 750 A1 | | 2/2002 |
| EP | 1 260 864 A1 | | 11/2002 |
| EP | 1273970 | | 1/2003 |
| JP | 11-109632 A | | 4/1999 |
| JP | 3042618 B2 | | 3/2000 |
| JP | 2000-338674 A | | 12/2000 |
| JP | 2001-109154 A | | 4/2001 |
| JP | 2001-183836 A | | 7/2001 |
| JP | 2001240625 | | 9/2001 |
| JP | 2002-23372-a | * | 1/2002 |
| JP | 2002251012 | | 9/2002 |

OTHER PUBLICATIONS

Derwent–ACC–NO:2001–550806, copyright 1999, Derwent information Ltd, 3 pages, printed Aug. 15, 2003.*
Sato et al , English machine translation of JP 2000–338674, publication date Dec. 12, 2000, 31 pages for Patent Abstrac of Japan, "Searching Paj" on the internet. www19.jpdl.jpo.go.*
Sato et al , English machine translation of JP 2002–023372, publication date Jan. 31, 2002, 32 pages for Patent Abstracts Japan, "Searching Paj" on the internet. www19.jpdl.jpo.go.*

* cited by examiner

Primary Examiner—Cynthia Hamilton
(74) Attorney, Agent, or Firm—Sughrue Mion, PLLC

(57) ABSTRACT

A positive resist composition comprising: (A) a resin capable of increasing the solubility in an alkali developer by the action of acid, in which the resin contains (A1) a repeating unit having at least one of a dihydroxyadamantyl group and a trihydroxyadamantyl group and (A2) a repeating unit containing an acid-decomposable group having an alicyclic structure; and (B) a compound capable of generating an acid upon irradiation with one of an actinic ray and a radiation, wherein the resin (A) contains the repeating unit (A1) and the repeating unit (A2) at a composition molar ratio: A1/A2 of from 0.15 to 1.0, and a total content of the repeating unit (A1) and the repeating unit (A2) in the resin (A) is 40 to 70 mole %.

15 Claims, No Drawings

POSITIVE RESIST COMPOSITION

FIELD OF THE INVENTION

The present invention relates to a positive resist composition usable in ultra-micro lithographic processes for production of VLSI and high-capacity microchips, and in other photofabrication processes.

BACKGROUND OF THE INVENTION

In recent years, integrated circuits have shown growing increases in their packing densities and in the production of semiconductor boards, such as VLSI, a process of forming ultra fine patterns having line widths of half micron or below has required. In order to meet such a requirement, wavelengths used in exposure apparatus for photolithography have become shorter and shorter, and now the use of excimer laser light (such as XeCl, KrF or ArF), namely light of shorter wavelengths in the far ultraviolet region, comes to be examined.

For pattern formation by photolithography in such a wavelength region, chemical amplification resists are usable.

Chemical-amplification resists are broadly classified into three groups known as a two-component system, a two-and-half-component system and a three-component system. The two-component system combines a compound capable of generating an acid when decomposed by light (a photo-acid generator) with a binder resin. The binder resin used in this system is a resin containing groups capable of decomposing under action of an acid and increasing resin's solubility in an alkali developer (acid-decomposable groups). The two-and-half-component system further contains a low-molecular-weight compound having an acid-decomposable group in addition to the photo-acid generator and the binder resin of the two-component system. The three-component system contains a photo-acid generator, an alkali-soluble resin, and a low-molecular-weight compound having an acid-decomposable group.

Although the chemical amplification resists are suitable as photoresists intended for ultraviolet or far ultraviolet irradiation, it is necessary for them to further support characteristics required from a working viewpoint.

As to photoresist compositions used in combination with an ArF light source, there is a proposal to introduce alicyclic hydrocarbon moieties into resins of the compositions for the purpose of imparting dry etching resistance. However, the introduction of alicyclic hydrocarbon moieties has a detrimental effect that the photoresist system becomes highly hydrophobic and difficult to dissolve in an aqueous tetramethylammonium hydroxide (TMAH) solution, or causes an undesirable phenomenon that the resist comes off the substrate during development.

With the intention of adapting to hydrophobicity of resins, measures of mixing organic solvents, such as isopropyl alcohol, in developers have been examined and made a fair success. However, those measures raise a concern about swelling of resist coatings and make processes complicated, and so it cannot always be said that they have resolved the problems. In approaches to improving resists, measures of introducing hydrophilic groups have often been taken to compensate for hydrophobicity of various alicyclic hydrocarbon moieties.

On the other hand, Japanese Patent Laid-Open No. 109632/1999 describes application of resins having polar group-containing alicyclic functional groups in addition to acid-decomposable groups in radiation-sensitive materials. And Japanese Patent No. 3042618 discloses the photoresist composition containing a polymer prepared by copolymerizing a (meth) acrylate derivative having a lactone structure and other polymerizable compounds.

As mentioned above, resins containing acid-decomposable groups, which are used in photoresists intended for exposure to far ultraviolet light, generally contain alicyclic hydrocarbon groups also in each individual molecule. Therefore, the resins become hydrophobic, and troubles arising therefrom are present. Although various measures to remedy such troubles have been examined, the arts as recited above still have many unsatisfactory points and improvements thereon are expected.

Further, Japanese Patent Laid-Open No. 2001-109154 discloses the positive photoresist composition containing a copolymer resin of alicyclic lactone and monohydroxyadamantane monomers, and thereby having high sensitivity, high resolution and improvement in pattern edge roughness. However, such a composition cannot provide sufficient improvements in a pattern topple problem and a surface roughening trouble upon etching. The term "pattern topple" as used herein means a phenomenon that, when line patterns are formed, they topple onto a substrate as they snap in the vicinity of their interface with the substrate.

In addition, Japanese Patent Laid-Open Nos. 2000-338674 and 2001-183836 disclose the resist compositions containing copolymer resins of dihydroxyadamantane monomers and acid-decomposable adamantane monomers. However, those compositions are also insufficient to effect improvements in pattern topple, surface roughening upon etching, edge roughness and pitch dependency.

SUMMARY OF THE INVENTION

Therefore, the invention aims to provide a positive resist composition which can be suitably used in ultra-micro lithographic processes for production of VLSI and high-capacity microchips and in other photofabrication processes, prevented from causing pattern topple, and improved in edge roughness, pitch dependency and surface roughening upon etching.

As a result of our intensive studies of materials for chemical-amplification positive resist compositions, it has been found that the present aim can be achieved by use of an acid-decomposable resin containing particular repeating units in specified proportions, which leads to the invention.

More specifically, the present aim is achieved by the following constitutions of the invention.

(1) A positive resist composition comprising:

(A) a resin capable of increasing the solubility in an alkali developer by the action of acid, in which the resin contains (A1) a repeating unit having at least one of a dihydroxyadamantyl group and a trihydroxyadamantyl group and (A2) a repeating unit containing an acid-decomposable group having an alicyclic structure; and (B) a compound capable of generating an acid upon irradiation with one of an actinic ray and a radiation, wherein the resin (A) contains the repeating unit (A1) and the repeating unit (A2) at a composition molar ratio: A1/A2 of from 0.15 to 1.0, and a total content of the repeating unit (A1) and the repeating unit (A2) in the resin (A) is 40 to 70 mole %.

(2) The positive resist composition as described in the item (1), wherein the composition molar ratio: A1/A2 is from 0.35 to 1.0.

(3) The positive resist composition as described in the item (1), wherein the composition molar ratio: A1/A2 is from 0.4 to 0.8 and the total content of the repeating unit (A1) and the repeating unit (A2) in the resin (A) is 45 to 65 mole %.

(4) The positive resist composition as described in the item (1), wherein the repeating unit (A1) is a repeating unit represented by formula (I):

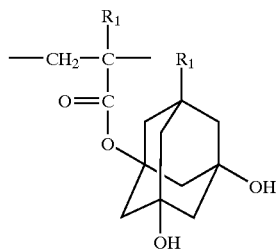

(I)

wherein $R_1$ represents a hydrogen atom, an alkyl group, a halogen atom or a cyano group, and $R_2$ represents a hydrogen atom or a hydroxyl group.

(5) The positive resist composition as described in the item (1), wherein the repeating unit (A2) is a repeating unit having a partial structure represented by any of formulae (pI) to (pVI):

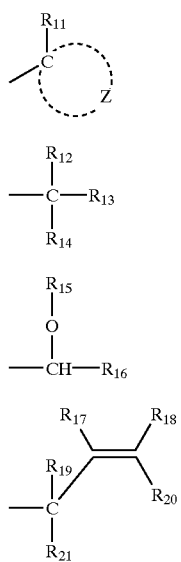

(pI)

(pII)

(pIII)

(pIV)

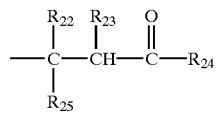

(pV)

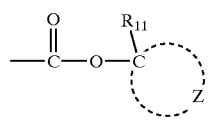

(pVI)

wherein $R_{11}$ represents a methyl group, an ethyl group, a n-propyl group, an isopropyl group, a n-butyl group, an isobutyl group or a sec-butyl group; Z represents an atom group forming an alicyclic hydrocarbon group together with the carbon atom; $R_{12}$ to $R_{16}$ each independently represent a linear or branched alkyl group having 1 to 4 carbon atoms or an alicyclic hydrocarbon group, provided that at least one of $R_{12}$, $R_{13}$ and $R_{14}$ is an alicyclic hydrocarbon group and either $R_{15}$ or $R_{16}$ is an alicyclic hydrocarbon group; $R_{17}$ to $R_{21}$ each independently represent a hydrogen atom, a linear or branched alkyl group having 1 to 4 carbon atoms or an alicyclic hydrocarbon group, provided that at least one of $R_{17}$ to $R_{21}$ is an alicyclic hydrocarbon group and either $R_{19}$ or $R_{21}$ is a linear or branched alkyl group having 1 to 4 carbon atoms or an alicyclic hydrocarbon group; $R_{22}$ to $R_{25}$ independently represent a linear or branched alkyl group having 1 to 4 carbon atoms or an alicyclic hydrocarbon group, provided that at least one of $R_{22}$ to $R_{25}$ is an alicyclic hydrocarbon group, and $R_{23}$ and $R_{24}$ may combine with each other to form a ring.

(6) The positive resist composition as described in the item (1), wherein the repeating unit (A2) is a repeating unit represented by formula (pA):

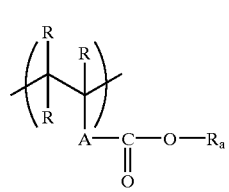

(pA)

wherein each R represents a hydrogen atom, a halogen atom or a linear or branched alkyl group having 1 to 4 carbon atoms, which may be substituted or unsubstituted; three R groups may be the same or different; A represents a single bond or a divalent linkage group; Ra represents a group represented by any of formulae (pI) to (pVI).

(7) The positive resist composition as described in the item (1), wherein the resin (A) further contains (A3) a repeating unit having an alicyclic lactone structure.

(8) The positive resist composition as described in the item (7), wherein the repeating unit (A3) is a repeating unit containing a group represented by any of formulae (V-1) to (V-4)

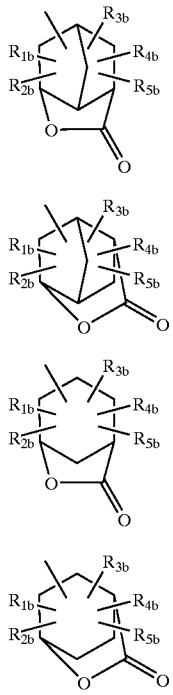

(V-1)

(V-2)

(V-3)

(V-4)

wherein $R_{1b}$ to $R_{5b}$ each independently represent a hydrogen atom or an alkyl, cycloalkyl or alkenyl group, which may be substituted; any two of $R_{1b}$ to $R_{5b}$ may combine with each other to form a ring.

(9) The positive resist composition as described in the item (7), wherein the repeating unit (A3) is a repeating unit represented by formula (AI):

(AI)

wherein $R_{b0}$ represents a hydrogen atom, a halogen atom, or a substituted or unsubstituted alkyl group having 1 to 4 carbon atoms; A' represents a single bond or a divalent linkage group; $B_2$ represents a group represented by any of the formulae (V-1) to (V-4).

(10) The positive resist composition as described in the item (1), wherein the resin (A) contains the repeating unit (A1) in an amount of from 5 to 30 mole %, based on the total repeating units.

(11) The positive resist composition as described in the item (1), wherein the resin (A) contains the repeating unit (A2) in an amount of from 24 to 55 mole %, based on the total repeating units.

(12) The positive resist composition as described in the item (7), wherein the resin (A) contains the repeating unit (A3) in an amount of from 5 to 65 mole %, based on the total repeating units.

(13) The positive resist composition as described in the item (7), wherein the resin (A) contains the repeating unit (A3) in an amount of from 10 to 60 mole %, based on the total repeating units.

(14) The positive resist composition as described in the item (7), wherein the resin (A) contains the repeating unit (A3) in an amount of from 15 to 55 mole %, based on the total repeating units.

(15) The positive resist composition as described in the item (1), which comprises the resin (A) in amount of 40 to 99.99 wt %, based on the total solid content in the positive resist composition.

(16) The positive resist composition as described in the item (1), which comprises the compound (B) in amount of 0.01 to 30 wt %, based on the total solid content in the positive resist composition.

(17) The positive resist composition as described in the item (1), which further comprises (C) a surfactant containing at least one of a fluorine atom and a silicon atom.

(18) The positive resist composition as described in the item (1), which further comprises (D) an organic basic compound.

DETAILED DESCRIPTION OF THE INVENTION

Components used in the present composition are described below in detail.

[1] Resin (A) Capable of Increasing the Solubility in an Alkali Developer by the Action of Acid (Acid-decomposable Resin):

In the invention, the suitable repeating units (A1) having dihydroxyadamantyl or trihydrosyadamantyl groups are repeating units represented by the foregoing formula (I).

In formula (I), the alkyl group represented by $R_1$ is a linear or branched alkyl group which may have a substituent.

Groups suitable as such a linear or branched alkyl group are linear or branched alkyl groups having 1 to 12 carbon atoms (1–12C), preferably 1–10C linear or branched alkyl groups, with examples including methyl, ethyl, propyl, isopropyl, n-butyll, isobutyl, sec-butyl, t-butyl, pentyl, hexyl, heptyl, octyl, nonyl and decyl groups.

And the halogen atom represented by $R_1$ in formula (I) is a fluorine atom, a chlorine atom, a bromine atom or an iodine atom.

The term "acid-decomposable group having alicyclic structure" (acid-decomposable alicyclic group) as used in the invention is defined as a structural unit designed so as to protect an alkali-soluble group by a residue eliminable under an acidic condition and contain an alicyclic structure in the protective group residue after release from protection. Examples of an alkali-soluble group include a carboxyl group, a sulfo group, a sulfonamido group, an N-sulfonylimido group and disulfonylimido group. Of these groups, carboxyl group is preferred over the others from the viewpoints of transmittance and exposure margin. As examples of an alicyclic group, mention may be made of cyclic hydrocarbon structures illustrated hereinafter.

The acid-decomposable alicyclic group-containing repeating units (A2) appropriate to the invention are selected from repeating units having partial structure containing an alicyclic hydrocarbon group, which are represented by any of the foregoing formulae (pI) to (pVI).

In formulae (pI) to (pVI), the alkyl group represented by each of $R_{12}$ to $R_{25}$ is a substituted or unsubstituted 1–4C linear or branched alkyl group, with examples including a methyl group, an ethyl group, a n-propyl group, an isopropyl group, a n-butyl group, an isobutyl group, a sec-butyl group and a t-butyl group. As examples of a substituent group the alkyl group as recited above may have, mention may be made of a 1–4C alkoxy group, a halogen atom (fluorine, chlorine, bromine or iodine atom), an acyl group, an acyloxy group, a cyano group, a hydroxyl group, a carboxyl group, an alkoxycarbonyl group and a nitro group.

The alicyclic hydrocarbon group represented by each of $R_{11}$ to $R_{25}$ or formed by combining Z and the carbon atom may be either monocyclic or polycyclic. Examples of such an alicyclic hydrocarbon group include groups respectively having monocyclo, bicyclo, tricyclo and tetracyclo structures containing at least 5 carbon atoms. The suitable numbers of carbon atoms contained in the cyclic structure is from 6 to 30, especially from 7 to 25. Each of these alicyclic hydrocarbon groups may have a substituent.

Structural examples of an alicyclic moiety contained in such an alicyclic hydrocarbon group as recited above are illustrated below.

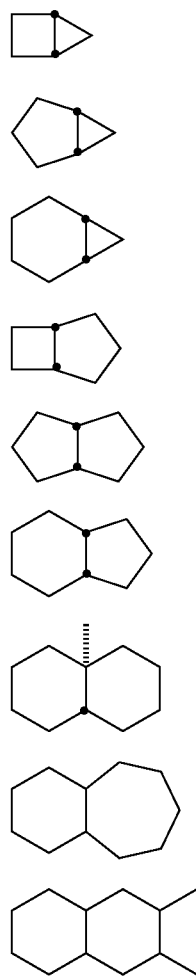

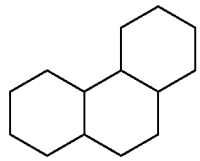

(10)

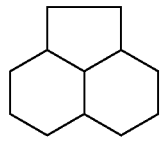

(11)

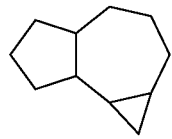

(12)

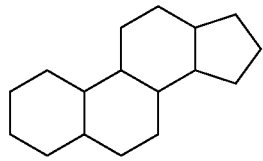

(13)

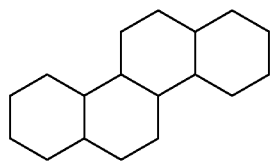

(14)

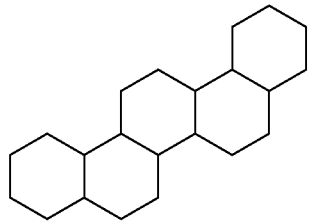

(15)

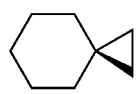

(16)

(17)

(18)

(19)

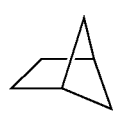

(20)

(21)
(22)
(23)
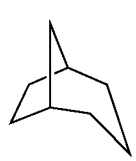
(24)
(25)
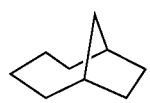
(26)
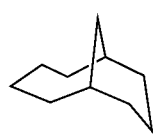
(27)
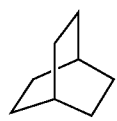
(28)
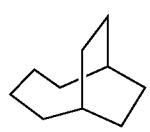
(29)
(30)
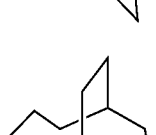
(31)
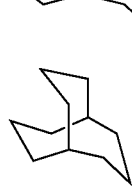
(32)
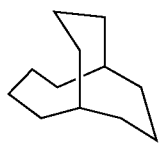
(33)
(34)
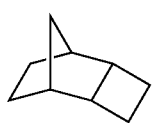
(35)
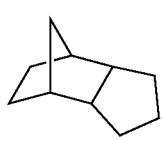
(36)
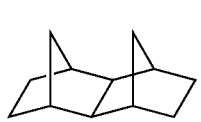
(37)
(38)
(39)
(40)
(41)
(42)
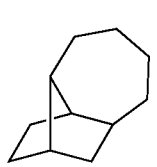
(43)
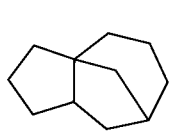
(44)

-continued

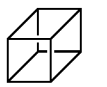
(45)

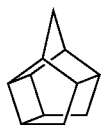
(46)

(47)

(48)

(49)

(50)

Of the groups containing the alicyclic moieties as illustrated above, groups preferred in the invention include an adamantyl group, a noradamantyl group, a decaline residue, a tricyclodecanyl group, a tetracyclododecanyl group, a norbornyl group, a sedorol group, a cyclohexyl group, a cycloheptyl group, a cyclooctyl group, a cyclodecanyl group and a cyclododecanyl group. And especially favorable groups are an adamantyl group, a decaline residue, a norbornyl group, a sedorol group, a cyclohexyl group, a cycloheptyl group, a cyclooctryl group, a cyclodecanyl group and a cyclododecanyl group.

As examples of a substituent the alicyclic hydrocarbon group as recited above may have, mention may be made of an unsubstituted and substituted alkyl group, a halogen atom, a hydroxyl group, an alkoxy group, a carboxyl group and an alkoxycarbonyl group. Examples of an unsubstituted alkyl group suitable as the substituent include lower alkyl groups such as methyl, ethyl, propyl, isopropyl and butyl groups, preferably methyl, ethyl, propyl and isopropyl groups. Examples of a substitutent of the substituted alkyl group include a hydroxyl group, a halogen atom and an alkoxy group. Examples of an alkoxy group suitable as the substituent include 1–4C alkoxy groups, such as methoxy, ethoxy, propoxy and a butoxy groups.

The structures represented by formulae (pI) to (pVI) in the resin (A) can be used for alkali-soluble group protection. Examples of an alkali-soluble group include various groups known in this technical field.

Specifically, examples of an alkali-soluble group include a carboxyl group, a sulfo group, a sulfonamido group, an N-sulfonylimido group and disulfonylimido group. Of these groups, carboxyl group is preferred over the others from the viewpoints of transmittance and exposure margin.

As suitable examples of alkali-soluble groups protected by the structures represented by formulae (pI) to (pVI), mention may be made of groups represented by the following formulae (pVII) to (pXI):

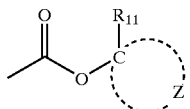
(pVII)

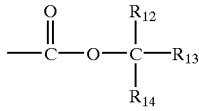
(pVIII)

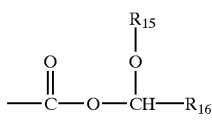
(pIX)

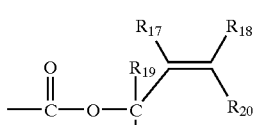
(pX)

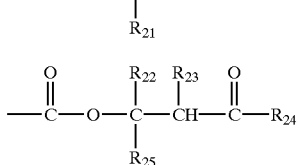
(pXI)

wherein $R_{11}$ to $R_{25}$ and Z have the same meanings as defined hereinbefore.

As the repeating units having alkali-soluble groups protected by structures represented by formulae (pI) to (pVI), repeating units represented by the following formula (pA) are preferred:

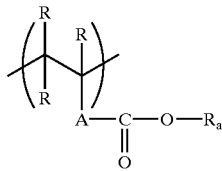
(pA)

Therein, each R represents a hydrogen atom, a halogen atom, or a 1–4C substituted or unsubstituted linear or branched alkyl group, and three R groups may be the same or different.

A represents a single bond or a divalent linkage group. The divalent linkage group includes a single group or a combination of at least two groups selected from the class consisting of an unsubstituted alkylene group, a substituted alkylene group, an ether group, a thioether group, a carbonyl group, an ester group, an amido group, a sulfonamido group, an urethane group and an urea group.

Ra represents any of the groups represented by formulae (pI) to (pVI).

Examples of a monomer corresponding to the repeating unit represented by formulae (pA) are illustrated below.

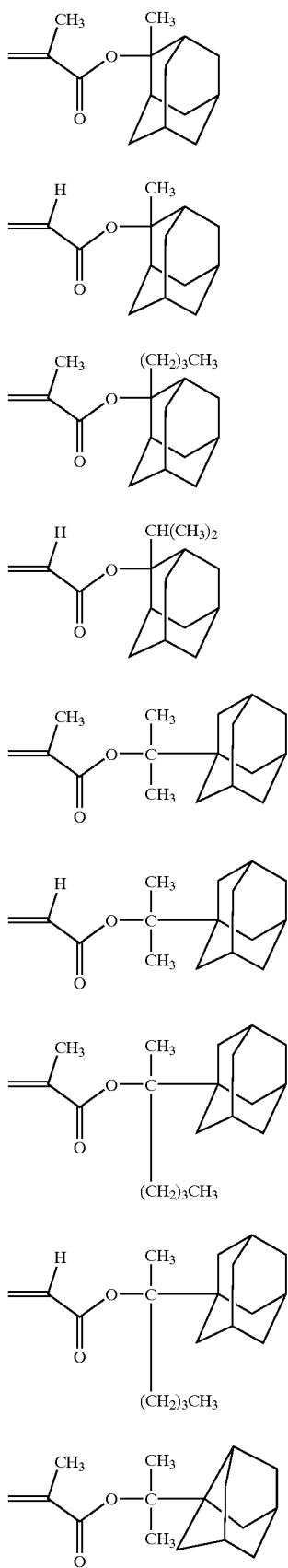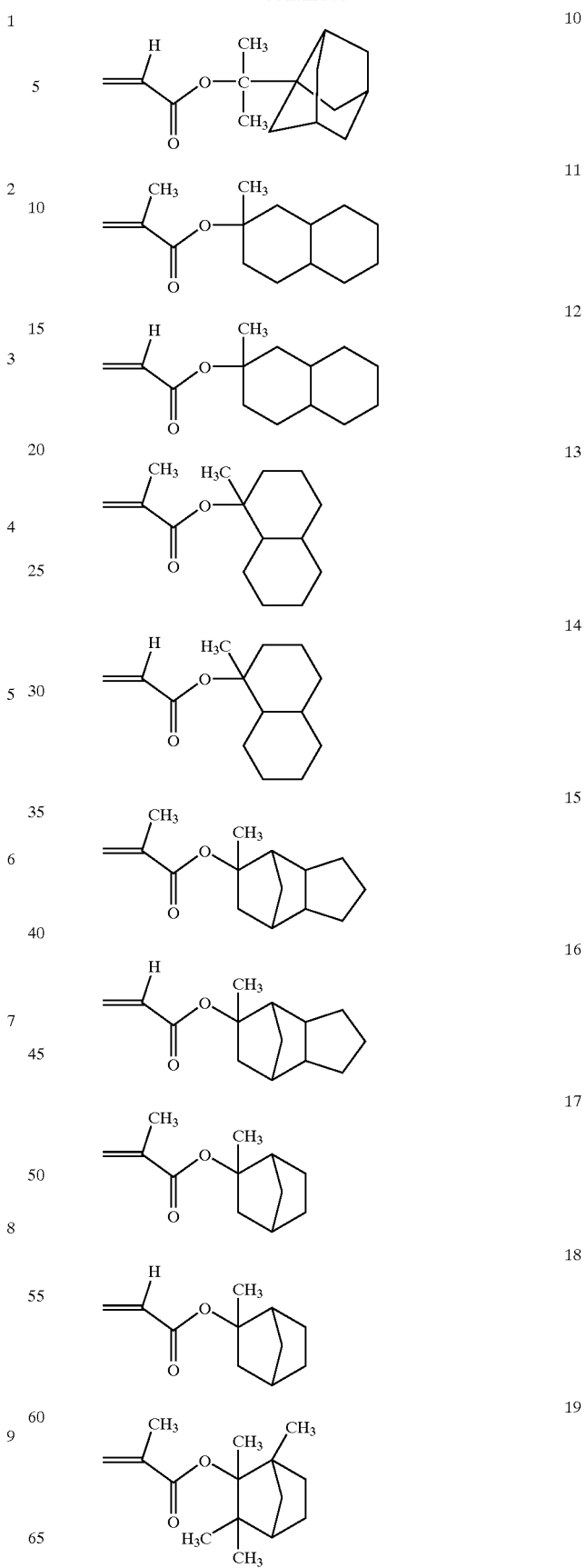

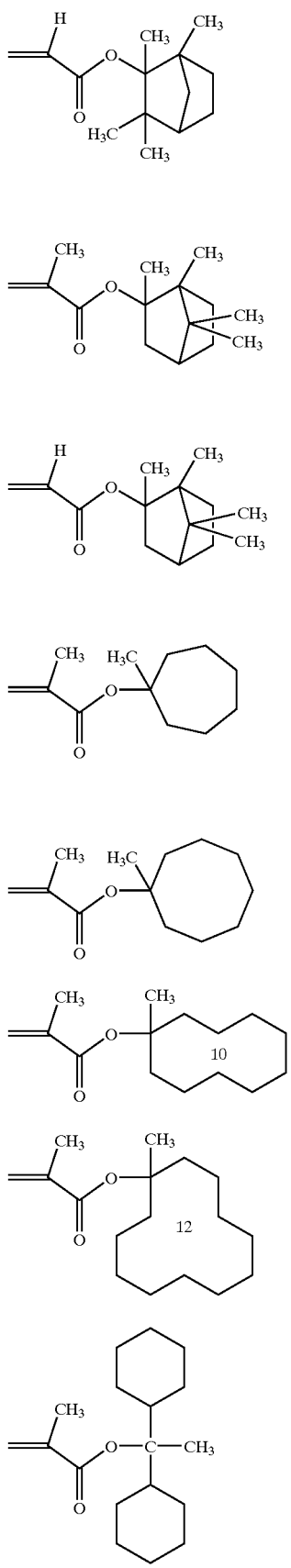
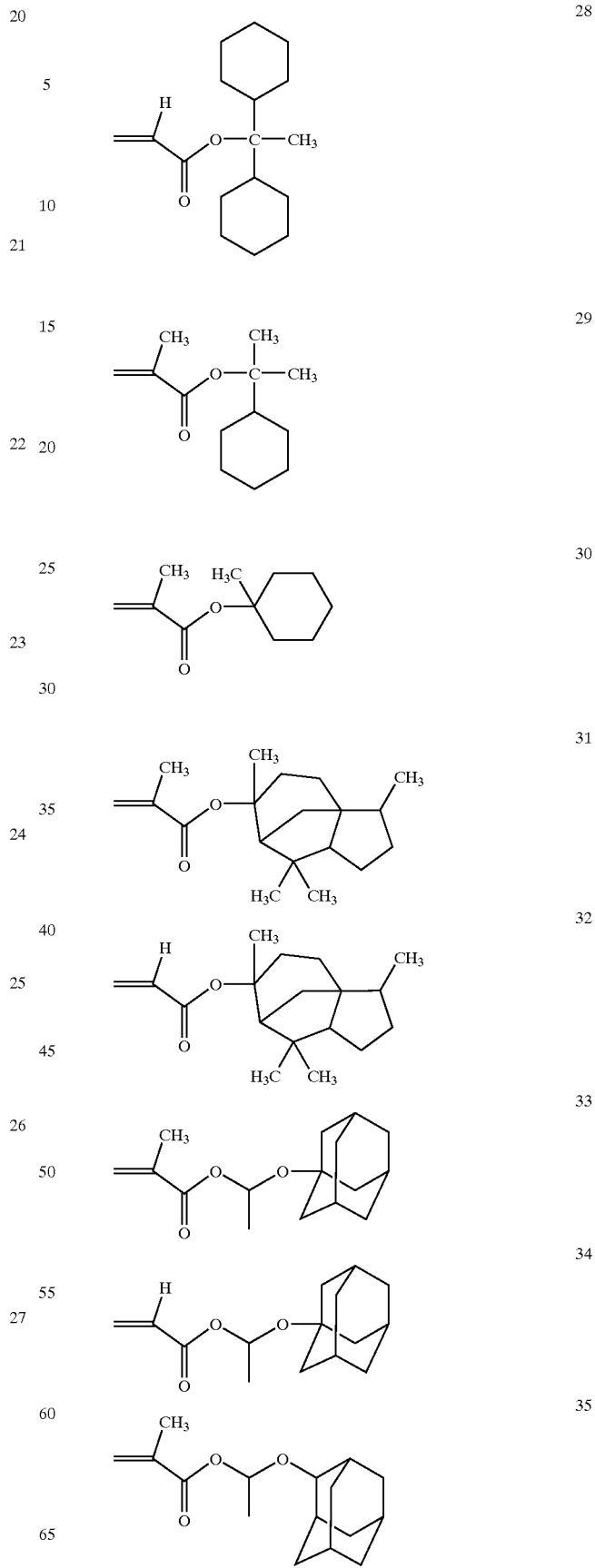

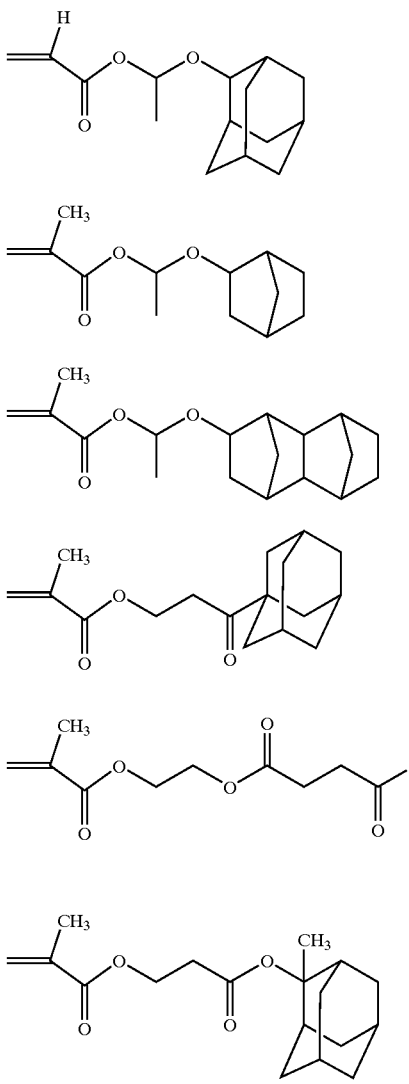

In the present acid-decomposable resin (A), it is required that the dihydroxyadamantyl or trihydroxyadamantyl group-containing repeating units (A1) and the acid-decomposable group-containing repeating units (A2) be contained at an A1/A2 compositional molar ratio of from 0.15 to 1.0, preferably from 0.35 to 1.0, and in a total proportion of 40 to 70 mole %. The A1/A2 compositional molar ratios smaller than 0.15 lead to deterioration in capabilities of preventing pattern topple and surface roughening upon etching. From the viewpoints of enhancing capabilities of preventing pattern topple and surface roughening upon etching, and further satisfying requirements for improvements in edge roughness and pitch dependency, A1/A2 ratios greater than 0.35 are preferable. However, A1/A2 ratios increased beyond 1.0 are undesirable because they cause deterioration in pattern topple-preventing capability. In addition, when the total proportion of A1 and A2 in the resin (A) is lower than 40 mole %, deterioration in resolution and edge roughness is caused. The total proportions higher than 70 mole % are also undesirable because they lead to deterioration in pitch dependency and capabilities of prevention against surface roughening upon etching and pattern topple.

More Preferably, the range of the A1/A2 ratio is from 0.4 to 0.8. On the other hand, the total proportion of A1 and A2 is more preferably in the range of 45 to 65 mole %. It is still more preferably that the range of the A1/A2 ratio is from 0.4 to 0.8 and the total proportion of A1 and A2 is in the range of 45 to 65 mole %.

In addition to the repeating units A1 and A2, the present acid-decomposable resin (A) preferably further contains alicyclic lactone repeating units (A3). The suitable alicyclic lactone repeating units (A3) includes repeating units containing groups represented by any of formulae (V-1) to (V-4) and repeating units containing groups represented by formula (VI). The alicyclic lactone repeating units are more preferable in view of a prevention against surface roughening upon etching and a pattern topple, compared with a repeating unit containing a conventional lactone residue. In the acid-decomposable resin, the proportion of the alicyclic lactone repeating units is preferably from 5 to 65 mole %, more preferably from 10 to 60 mole %, particularly preferably from 15 to 55 mole %, of the total repeating units. Of the alicyclic lactone repeating units, the repeating units containing any one of groups represented by formulae (V-1) to (V-5) are preferably in view of the prevention of a pattern topple.

In formulae (V-1) to (V-4), $R_{1b}$ to $R_{5b}$ independently represent a hydrogen atom, or an unsubstituted or substituted alkyl, cycloalkyl or alkenyl group. Any two of $R_{1b}$ to $R_{5b}$ may combine with each other to form a ring.

Alkyl groups represented by $R_{1b}$ to $R_{5b}$ in formulae (V-1) to (V-4) may be either linear or branched ones, and may have substituents.

Suitable examples of linear and branched alkyl groups include 1–12C linear and branched alkyl groups, preferably 1–10C linear and branched alkyl groups. In particular, methyl, ethyl, propyl, isopropyl, n-butyl, isobutyl, sec-butyl, t-butyl, pentyl, hexyl, heptyl, octyl, nonyl and decyl groups are favorable.

Suitable examples of a cycloalkyl group represented by $R_{1b}$ to $R_{5b}$ each include 3–8C cycloalkyl groups, such as cyclopropyl, cyclopentyl, cyclohexyl, cycloheptyl and cyclooctyl groups.

Suitable examples of an alkenyl group represented by $R_{1b}$ to $R_{5b}$ each include 2–6C alkenyl groups, such as vinyl, propenyl, butenyl and hexenyl groups.

Examples of a ring formed by combining any two of $R_{1b}$ to $R_{5b}$ include 3- to 8-menbered rings, such as cyclopropane, cyclobutane, cyclopentane, cyclohexane and cyclooctane rings.

Additionally, $R_{1b}$ to $R_{5b}$ in formulae (V-1) to (V-4) may be attached to any of carbons constituting a cyclic skeleton.

As suitable examples of substituents the alkyl, cycloalkyl and alkenyl groups may have, mention may be made of 1–4C alkoxy groups, halogen atoms (fluorine, chlorine, bromine and iodine atoms), 2–5C acyl groups, 2–5C acyloxy groups, a cyano group, a hydroxyl group, a carboxyl group, 2–5C alkoxycarbonyl groups and a nitro group.

As the repeating units having groups represented by formulae (V-1) to (V-4) respectively, mention may be made of repeating units represented by the following formula (AI).

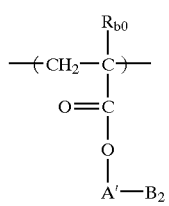

(AI)

In the formula (AI), $R_{b0}$ represents a hydrogen atom, a halogen atom, or a 1–4C substituted or unsubstituted alkyl group. As suitable examples of a substituent the alkyl group represented by $R_{b0}$ may have, mention may be made of the same ones as recited above as the alkyl group represented by $R_{1b}$ in formula (V-1) to (V-4) each may appropriately have.

Examples of a halogen atom represented by $R_{b0}$ include a fluorine atom, a chlorine atom, a bromine atom and an iodine atom. Preferably, $R_{b0}$ is a hydrogen atom.

A' represents a single bond or a divalent linkage group. The divalent linkage group includes an ether group, an ester group, a carbonyl group, an alkylene group or a divalent group formed by combining at least two of these groups.

$B_2$ represents a group represented by any of formulae (V-1) to (V-4).

Examples of a combined divalent group represented by A' include those of the following formulae:

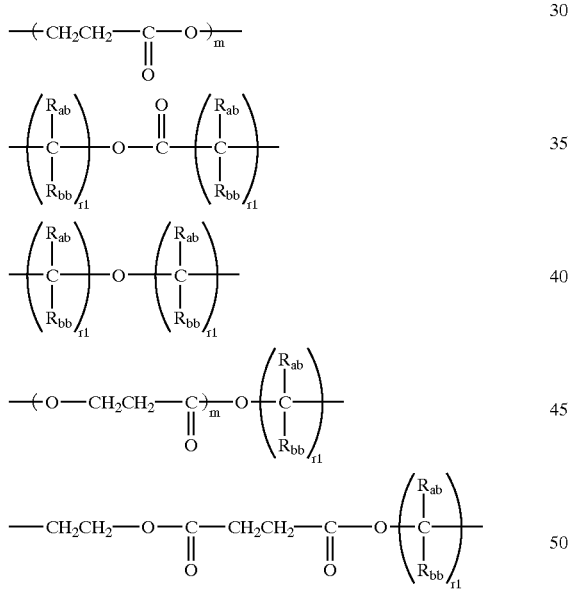

In the above formulae, $R_{ab}$ and $R_{bb}$ each represent a hydrogen atom, an unsubstituted or substituted alkyl group, a halogen atom, a hydroxyl group or an alkoxy group, and they both may be the same or different.

The unsubstituted alkyl group suitable as $R_{ab}$ and $R_{bb}$ each is a lower alkyl group, such as methyl, ethyl, propyl, isopropyl or butyl group, preferably methyl, ethyl, propyl or isopropyl group. As examples of a substituent the alkyl group can have, mention may be made of a hydroxyl group, a halogen atom and 1–4C alkoxy groups.

Examples of an alkoxy group include 1–4C alkoxy groups, such as methoxy, ethoxy, propoxy and butoxy groups. Examples of a halogen atom include a chlorine atom, a bromine atom, a fluorine atom and an iodine atom. r1 is an integer of 1 to 10, preferably an integer of 1 to 4. m is an integer of 1 to 3, preferably 1 or 2.

Examples of repeating units represented by formula (AI) are illustrated below, but these examples should not be construed as limiting the scope of the invention.

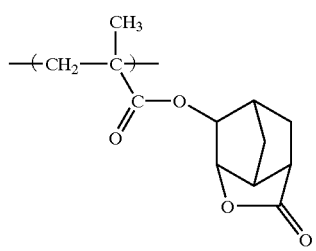

(Ib-1)

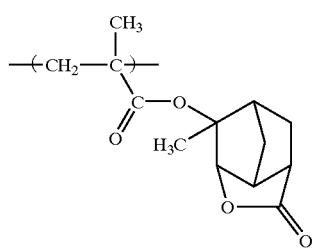

(Ib-2)

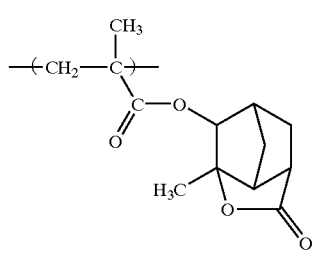

(Ib-3)

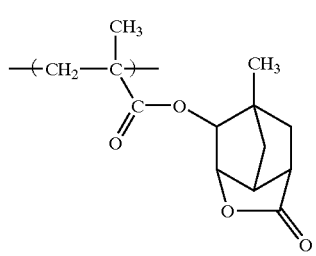

(Ib-4)

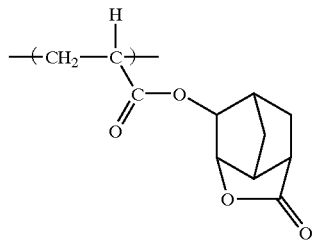

(Ib-5)

(Ib-6) 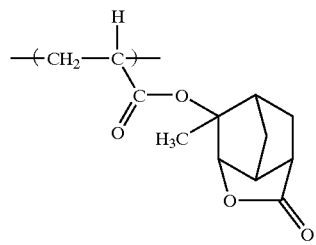
(Ib-7) 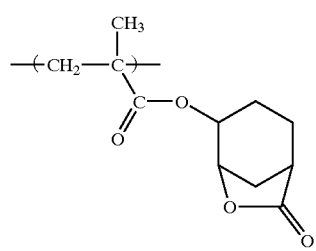
(Ib-8) 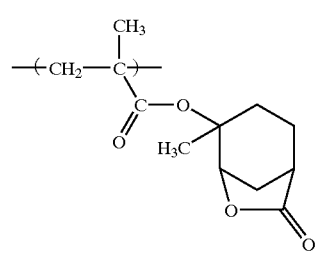
(Ib-9) 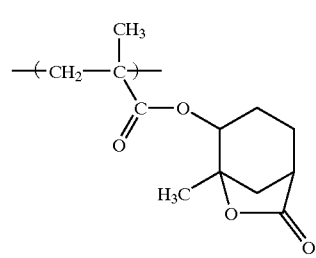
(Ib-10) 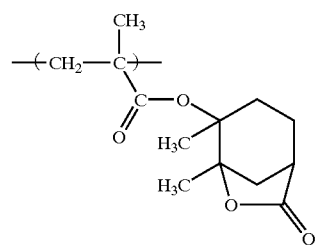
(Ib-11) 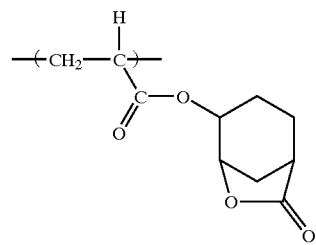
(Ib-12) 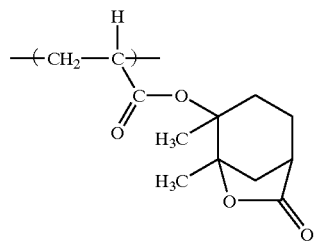
(Ib-13) 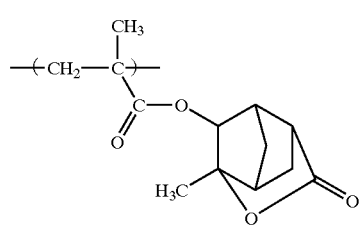
(Ib-14) 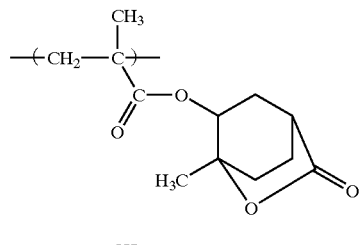
(Ib-15) 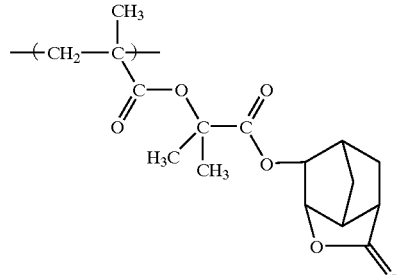
(Ib-16) 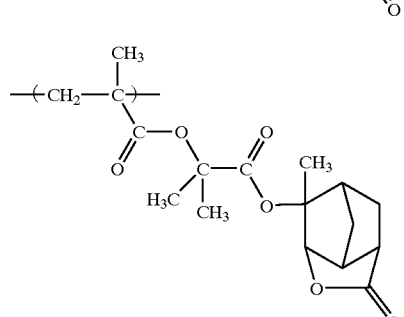
(Ib-17) 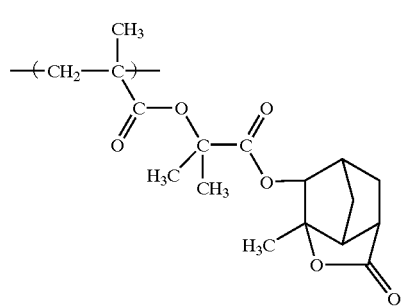

(Ib-18)
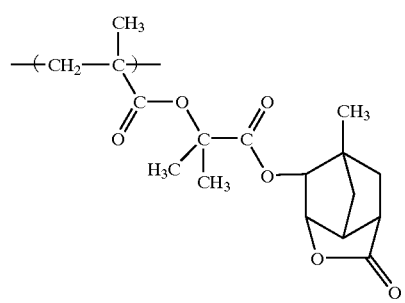
(Ib-19)
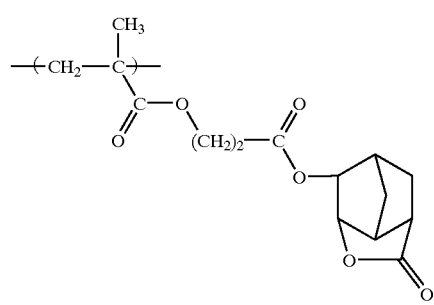
(Ib-20)
(Ib-21)
(Ib-22)
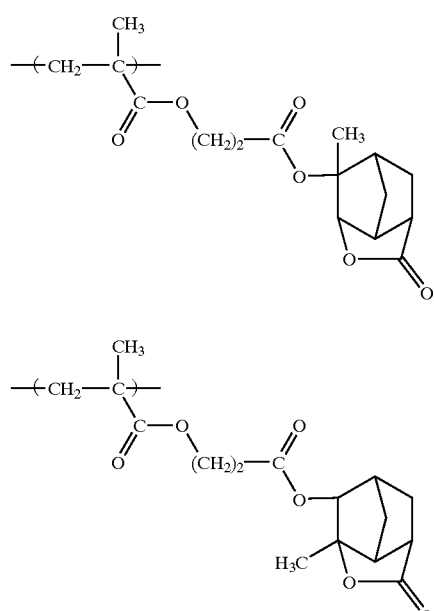
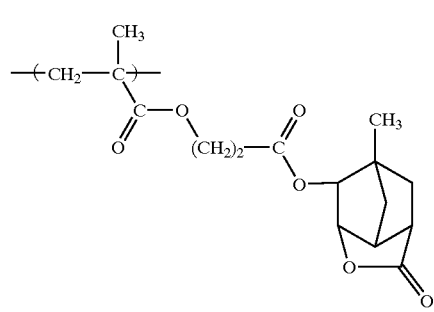
(Ib-23)
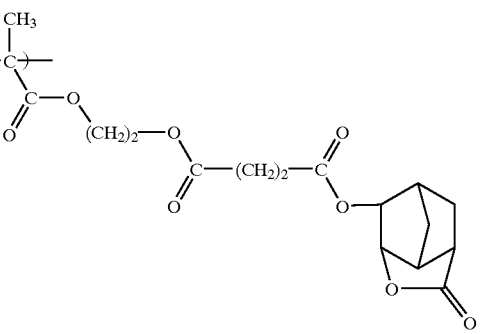
(Ib-24)
(Ib-25)
(Ib-26)
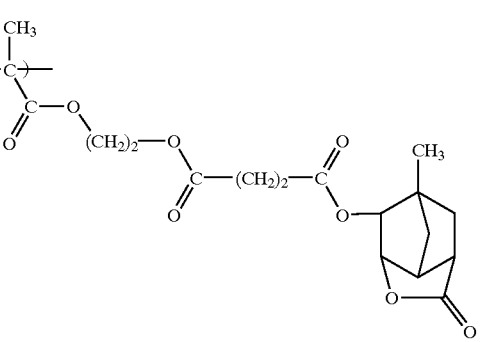

(Ib-27)
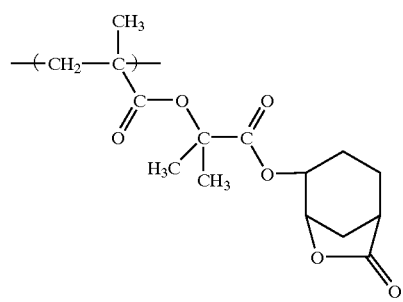
(Ib-28)
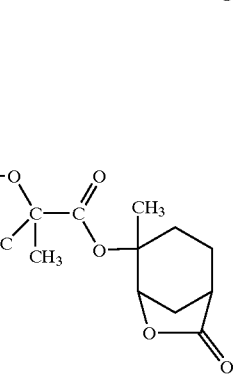
(Ib-29)
(Ib-30)
(Ib-31)
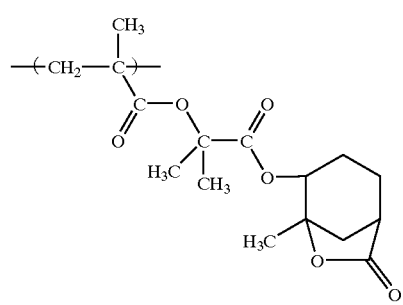
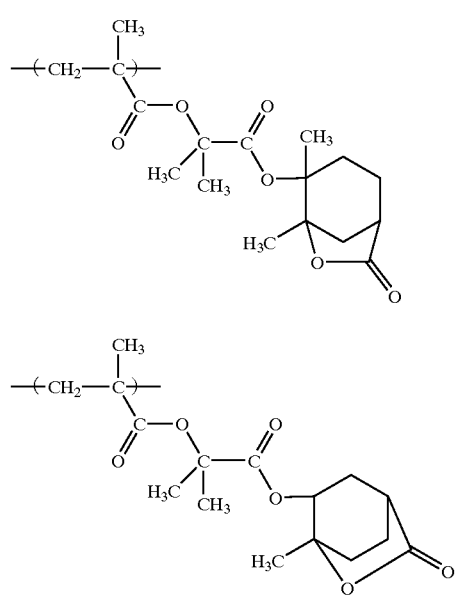
(Ib-32)
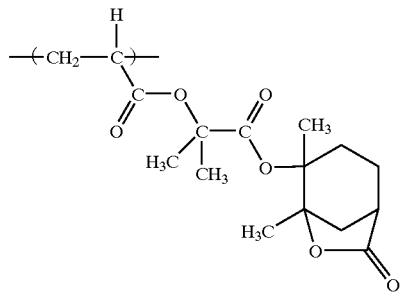
(Ib-33)
(Ib-34)
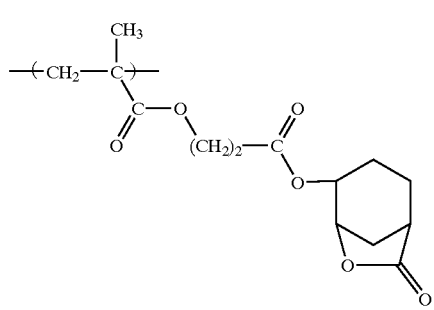
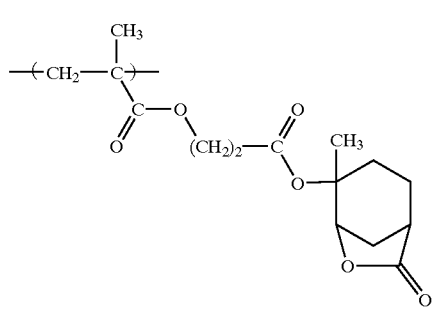
(Ib-35)
(Ib-36)
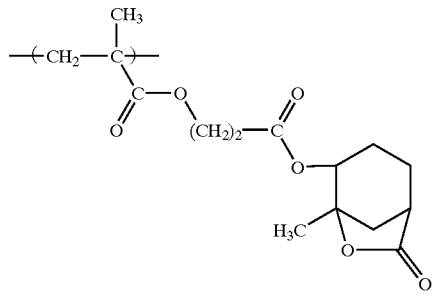
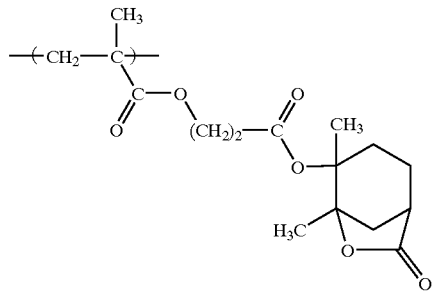

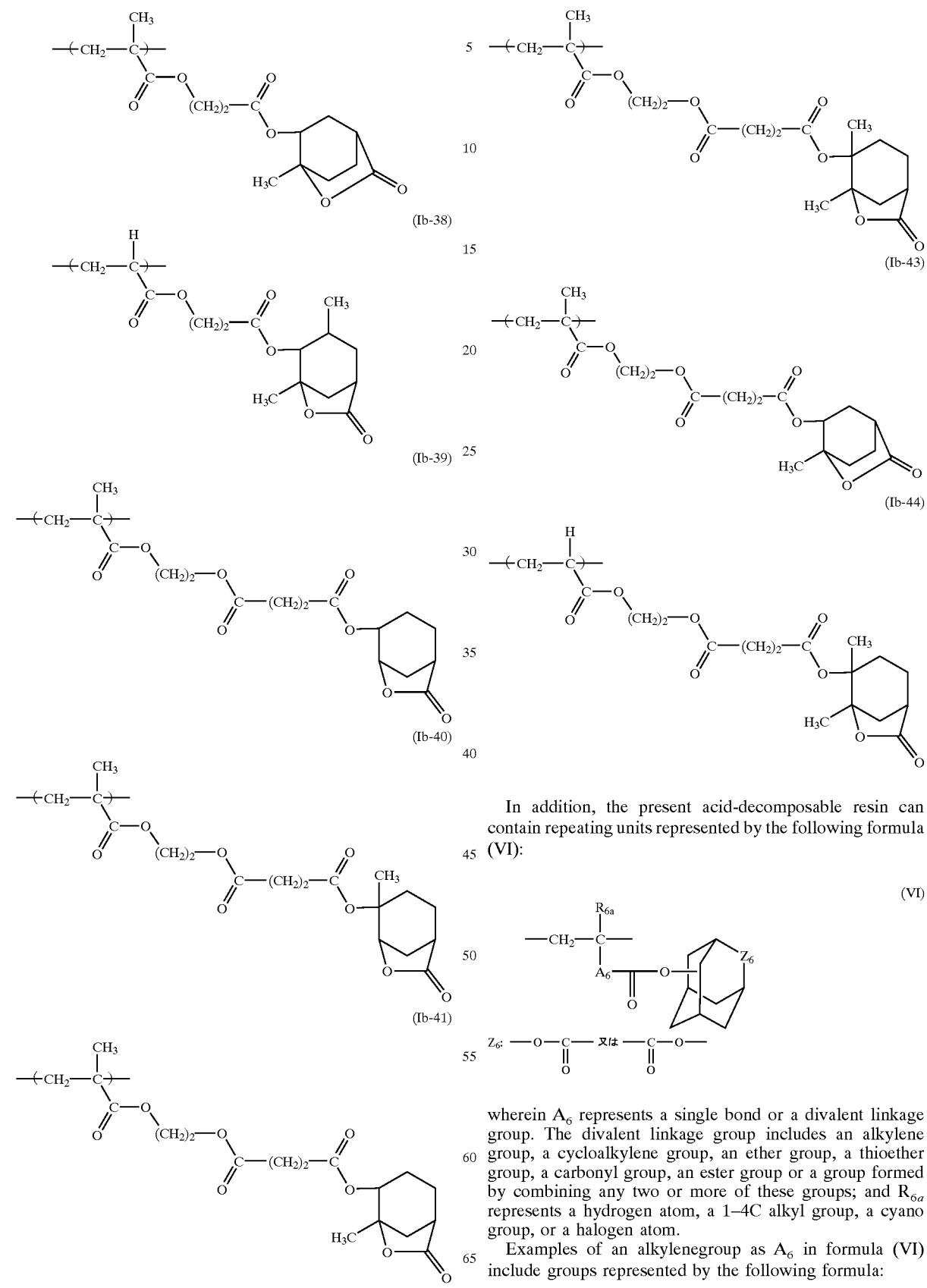

In addition, the present acid-decomposable resin can contain repeating units represented by the following formula (VI):

wherein $A_6$ represents a single bond or a divalent linkage group. The divalent linkage group includes an alkylene group, a cycloalkylene group, an ether group, a thioether group, a carbonyl group, an ester group or a group formed by combining any two or more of these groups; and $R_{6a}$ represents a hydrogen atom, a 1–4C alkyl group, a cyano group, or a halogen atom.

Examples of an alkylenegroup as $A_6$ in formula (VI) include groups represented by the following formula:

$$-[C(Rnf)(Rng)]_r-$$

wherein Rnf and Rng each represent a hydrogen atom, an unsubstituted or substituted alkyl group, a halogen atom, a hydroxyl group or an alkoxy group, and they both may be the same or different. As the alkyl group, a lower alkyl group, such as methyl, ethyl, propyl, isopropyl or butyl group, is suitable. Preferably, the lower alkyl group is methyl, ethyl, propyl or isopropyl group. As examples of a substituent the alkyl group can have, mention may be made of a hydroxyl group, a halogen atom and an alkoxy group. Examples of an alkoxy group include 1–4C alkoxy groups, such as methoxy, ethoxy, propoxy and butoxy groups. As examples of a halogen atom, mention may be made of chlorine, bromine, fluorine and iodine atoms. r is an integer of 1 to 10.

Examples of a cycloalkylene group as $A_6$ in formula (VI) include those containing 3 to 10 carbon atoms, such as cyclopentylene, cyclohexylene and cyclooctylene groups.

The $Z_6$-containing bridged alicyclic ring may have a substituent. As examples of a substituent such a ring may have, mention may be made of a halogen atom, an alkoxy group (preferably containing 1 to 4 carbon atoms), an alkoxycarbonyl group (preferably containing 1 to 5 carbon atoms), an acyl group (e.g., formyl, benzoyl), an acyloxy group (e.g., propylcarbonyloxy, benozyloxy), an alkyl group (preferably containing 1 to 4 carbon atoms), a carboxyl group, a hydroxyl group, and an alkylsulfonylcarbamoyl group (e.g., —$CONHSO_2CH_3$). Additionally, the alkyl group as a substituent may further be substituted with a hydroxyl group, a halogen atom or an alkoxy group (preferably containing 1 to 4 carbon atoms).

The oxygen atom of the ester group linked to $A_6$ in formula (VI) may be attached to any of carbon atoms constituting the $Z_6$-containing bridged alicyclic ring structure.

Examples of repeating units represented by formula (VI) are illustrated below, but these examples should not be construed as limiting the scope of the invention.

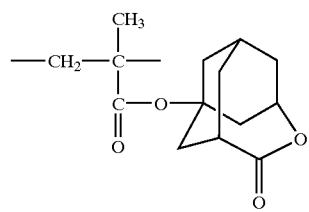

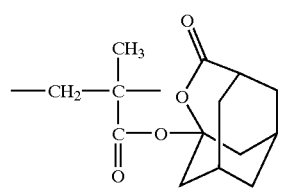

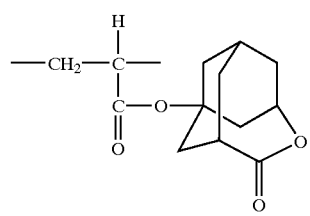

-continued

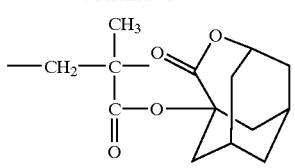

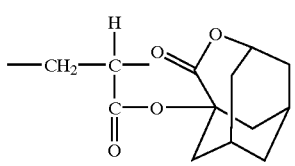

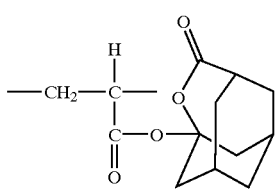

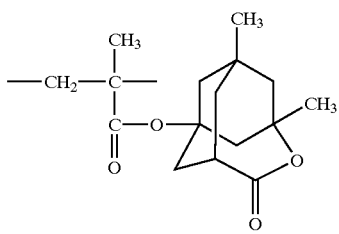

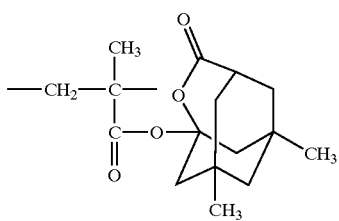

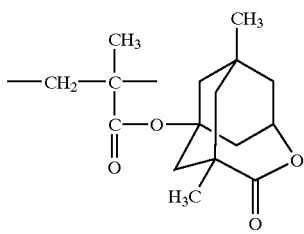

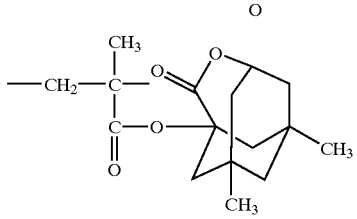

-continued

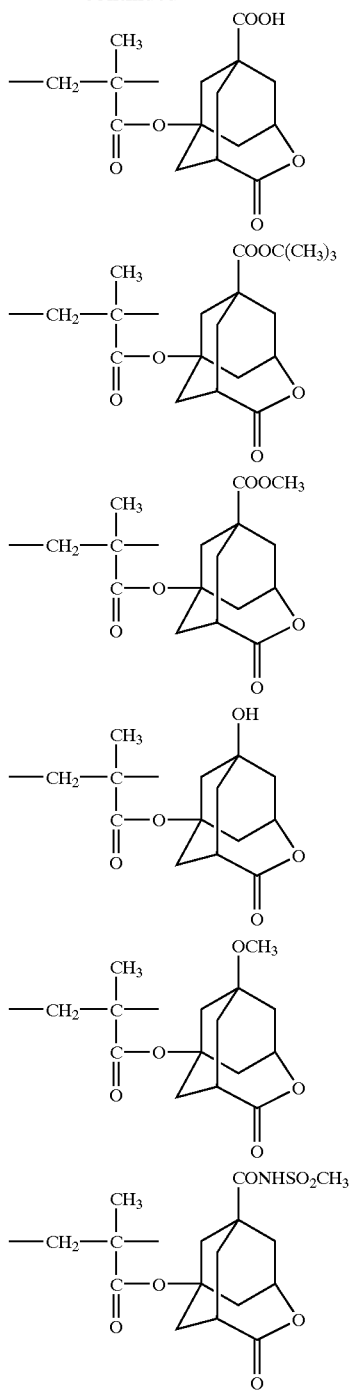

The present acid-decomposable resin (A) can further contain lactone structure-containing repeating units represented by the following formula (IV):

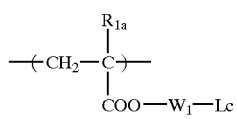

-continued

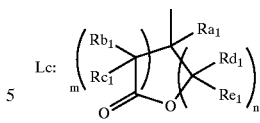

In the formula (IV), $R_{1a}$ represents a hydrogen atom or a methyl group.

$W_1$ represents a single bond or a divalent linkage group. The divalent linkage group includes an alkylene group, an ether group, a thioether group, a carbonyl group, an ester group, or a group formed by combining at least two of these groups.

$R_{a1}$, $R_{b1}$, $R_{c1}$, $R_{d1}$ and $R_{e1}$ independently represent a hydrogen atom or a 1–4C alkyl group. m and n independently represents an integer of 0 to 3, provided that m+n is from 2 to 6.

Examples of a 1–4C alkyl group as $R_{a1}$ to $R_{e1}$ each include a methyl group, an ethyl group, a propyl group, an isopropyl group, a n-butyl group, an isobutyl group, a sec-butyl group and a t-butyl group.

Examples of an alkylene group represented by $W_1$ in formula (IV) include groups represented by the following formula:

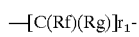

wherein Rf and Rg each represent a hydrogen atom, an unsubstituted or substituted alkyl group, a halogen atom, a hydroxyl group or an alkoxy group, and they both may be the same or different. As the alkyl group, a lower alkyl group, such as methyl, ethyl, propyl, isopropyl or butyl group, is suitable. Preferably, the alkyl group is a methyl, ethyl, propyl or isopropyl group. As examples of a substituent the alkyl group can have, mention may be made of a hydroxyl group, a halogen atom and an alkoxy group. Examples of an alkoxy group include 1–4C alkoxy groups, such as methoxy, ethoxy, propoxy and butoxy groups. As examples of a halogen atom, mention may be made of chlorine, bromine, fluorine and iodine atoms. $r_1$ is an integer of 1 to 10.

As examples of a substituent group the alkyl group can further have, mention may be made of a carboxyl group, an acyloxy group, a cyano group, an unsubstituted or substituted alkyl group, a halogen atom, a hydroxyl group, an unsubstituted or substituted alkoxy group, an acetylamido group, an alkoxycarbonyl group and an acyl group.

Therein, the alkyl group can be a lower alkyl group, such as methyl, ethyl, propyl, isopropyl, butyl, cyclopropyl, cyclobutyl or cyclopentyl group. The substitutent of the substituted alkyl group can be a hydroxyl group, a halogen atom, or an alkoxy group. The alkoxy group can be a lower alkoxy group, such as methoxy, ethoxy, propoxy or butoxy group. The acyloxy group can be an acetoxy group. The halogen atom can be a chlorine atom, a bromine atom, a fluorine atom or an iodine atom.

Examples of repeating units represented by formula (IV) are illustrated below, but these examples should not be construed as limiting the scope of the invention.

(IV-1) 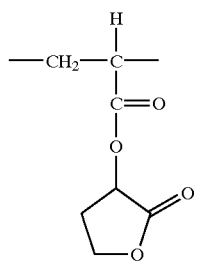
(IV-2) 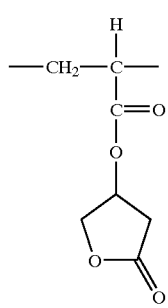
(IV-3) 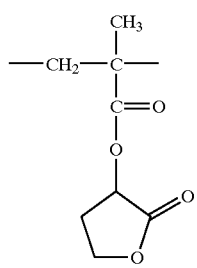
(IV-4) 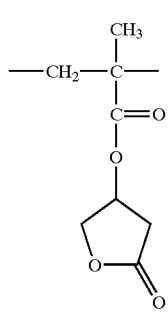
(IV-5) 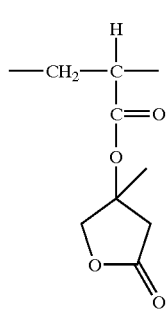
-continued
(IV-6) 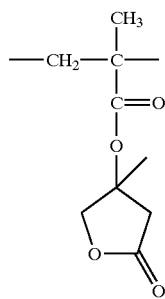
(IV-7) 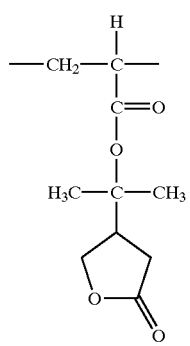
(IV-8) 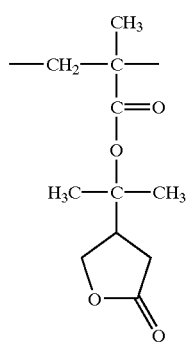
(IV-9) 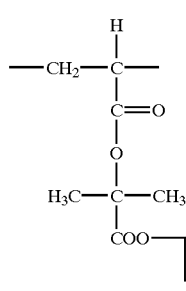
(IV-10) 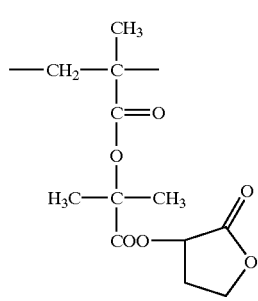

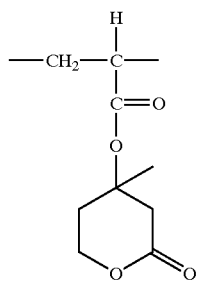
(IV-11)
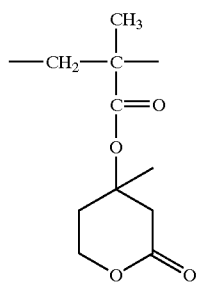
(IV-12)
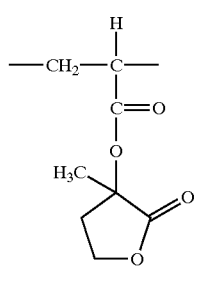
(IV-13)
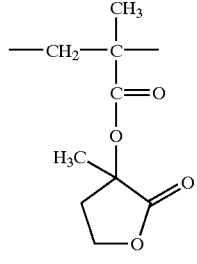
(IV-14)
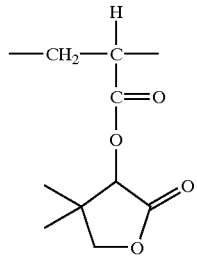
(IV-15)
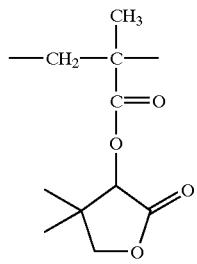
(IV-16)
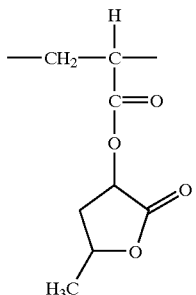
(IV-17)
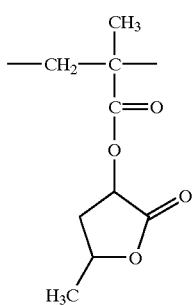
(IV-18)
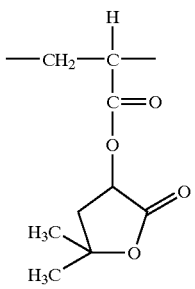
(IV-19)
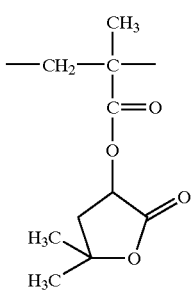
(IV-20)
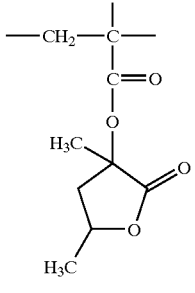
(IV-21)

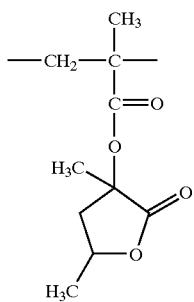
(IV-22)
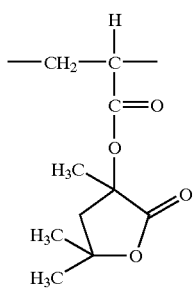
(IV-23)
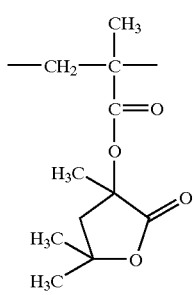
(IV-24)
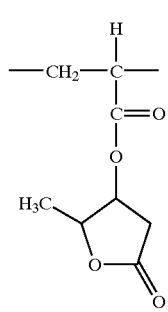
(IV-25)
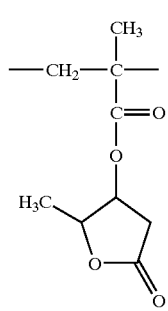
(IV-26)
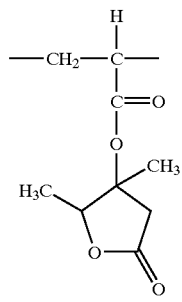
(IV-27)
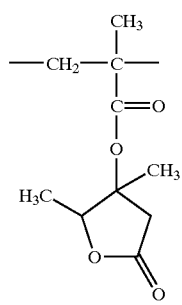
(IV-28)
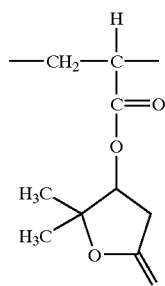
(IV-29)
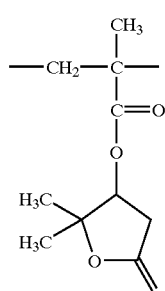
(IV-30)
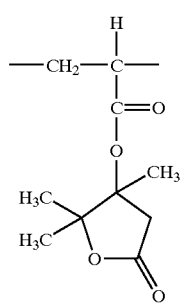
(IV-31)

(IV-32)
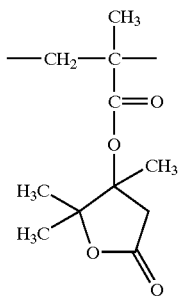

(IV-33)
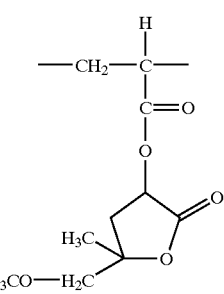

(IV-34)
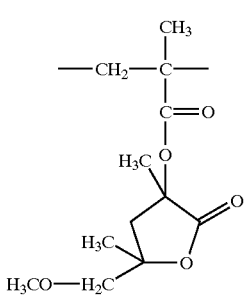

(IV-35)
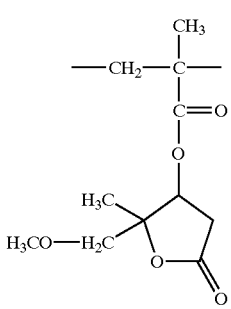

(IV-36)
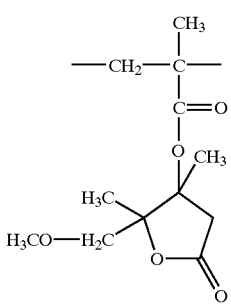

Of these repeating units exemplifying formula (IV), the repeating units (IV-17) to (IV-36) are preferred over the others, because they can improve exposure margin.

Further, it is desirable from the viewpoint of improving edge roughness that the acrylate structure be included in the formula (IV).

The present acid-decomposable resin (A) may further contain repeating units having groups represented by the following formula (VII):

(VII)
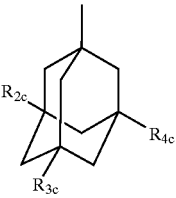

wherein $R_{3c}$ represents a hydroxyl group, and $R_{2c}$ and $R_{4c}$ independently represent a hydrogen atom or an alkyl group. It is appropriate for the alkyl group to contain 1 to 4 carbon atoms.

As the repeating units having groups represented by formula (VII), mention may be made of repeating units represented by the following formula (AII):

(AII)
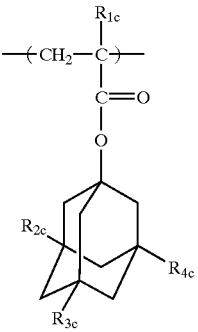

wherein $R_{1c}$ represents a hydrogen atom or a methyl group, $R_{3c}$ represents a hydroxyl group, and $R_{2c}$ and $R_{4c}$ independently represents a hydrogen atom or an alkyl group. As the alkyl group, a 1–4C alkyl group is suitable.

Examples of repeating units having the structures represented by formula (AII) are illustrated below, but these examples should not be construed as limiting the scope of the invention.

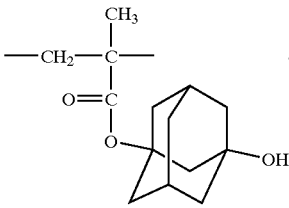 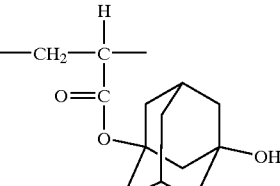

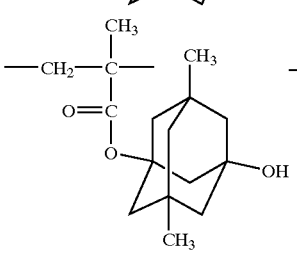 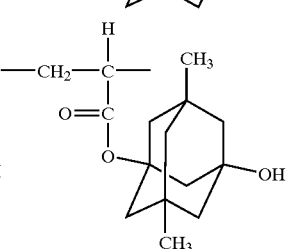

-continued

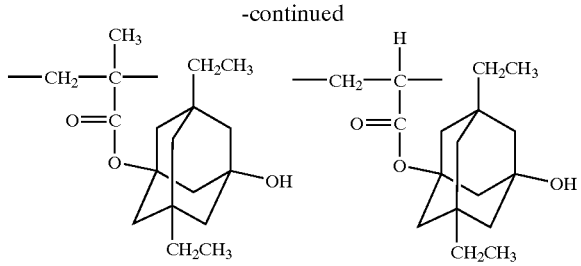

In addition to the repeating units described above, the acid-decomposable resin as Component (A) can contain various repeating units for the purpose of adjusting dry etching resistance, standard developer suitability, adhesion to a substrate, resist profile, and characteristics generally required for resist, such as resolution, heat resistance and sensitivity.

As examples of those repeating units, mention may be made of repeating units derived from monomers recited below. However, these examples should not be construed as limiting the scope of the invention.

By containing such repeating units, it becomes possible to make fine adjustments of capabilities required for the acid-decomposable resin, especially
(1) solubility in coating solvents,
(2) film formability (glass transition temperature),
(3) alkali developability,
(4) prevention from lessening film thickness (hydrophile-hydrophobe balance, alkali-soluble group selectivity),
(5) adhesion of unexposed areas to a substrate, and
(6) dry etching resistance.

Those monomers can be selected from compounds containing one addition-polymerizable unsaturated bond per molecule, with examples including acrylic acid esters, methacrylic acid esters, acrylamides, methacrylamides, allyl compounds, vinyl ethers and vinyl esters.

More specifically, those compounds include the following monomers.

The acrylic acid esters are preferably alkyl acrylates which contain 1 to 10 carbon atoms in their respective alkyl moieties. Examples of such alkyl acrylates include methyl acrylate, ethyl acrylate, propyl acrylate, amyl acrylate, cyclohexyl acrylate, ethylhexyl acrylate, octyl acrylate, t-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, benzyl acrylate, methoxybenzyl acrylate, furfuryl acrylate and tetrahydrofurfuryl acrylate.

The methacrylic acid esters are preferably alkyl methacrylates which contain 1 to 10 carbon atoms in their respective alkyl moieties. Examples of such methacrylates include methyl methacrylate, ethyl methacrylate, propyl methacrylate, isopropyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, furfuryl methacrylate and tetrahydrofurfuryl methacrylate.

Examples of acrylamides include acrylamide, N-alkylacrylamides (which each have an alkyl moiety containing 1 to 10 carbon atoms, such as methyl, ethyl, propyl, butyl, 5-butyl, heptyl, octyl, cyclohexyl or hydroxyethyl group), N,N-dialkylacrylamides (which each have an alkyl moiety containing 1 to 10 carbon atoms, such as methyl, ethyl, butyl, isobutyl, ethylhexyl or cyclohexyl group), N-hdyroxyethyl-N-methylacrylamide and N-2-acetamidoethyl-N-acetylacrylamide.

Examples of methacrylamides include methacrylamide, N-alkylmethacrylamides (which each have an alkyl moiety containing 1 to 10 carbon atoms, such as methyl, ethyl, t-butyl, ethylhexyl, hydroxyethyl or cyclohexyl group), N,N-dialkylmethacrylamides (the alkyl moieties of which include ethyl, propyl and butyl groups), and N-hydroxyethyl-N-methylmethacrylamide.

Examples of allyl compounds include allyl esters (such as allyl acetate, allylcaproate, allylcaprylate, allyllaurate, allyl palmitate, allyl stearate, allyl benzoate, allyl acetacetate and allyl lactate), and allyloxyethanol.

Examples of vinyl ethers include alkyl vinyl ethers (such as hexyl vinyl ether, octyl vinyl ether, decyl vinyl ether, ethylhexyl vinyl ether, methoxyethyl vinyl ether, etoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, and tetrahydrofurfuryl vinyl ether.

Examples of vinyl esters include vinyl butyrate, vinyl isobutyrate, vinyl trimethylacetate, vinyl diethylacetate, vinyl valerate, vinyl caproate, vinyl chloroacetate, vinyl dichloroacetate, vinyl methoxyacetate, vinyl butoxyacetate, vinyl acetacetate, vinyl lactate, vinyl-β-phenylbutyrate, and vinyl chlorohexylcarboxylate.

In addition to the compounds recited above, other monomers which can be used include dialkyl itaconates, such as dimethyl itaconate, diethyl itaconate and dibutyl itaconate.

Further, di- and monoalkyl fumarates (e.g., dibutyl fumarate) can be used as the monomers.

Also, crotonic acid, itaconic acid, maleic anhydride, maleimide, acrylonitrile, methacrylonitrile and maleylonitrile may be used as the monomers.

Besides the monomers recited above, addition-polymerizable unsaturated compounds may be used as comonomers as long as they can form copolymers together with monomers corresponding to the various repeating units as illustrated above.

The molar ratio between repeating units to constitute the acid-decomposable resin is chosen appropriately so as to adjust dry etching resistance of resist, standard developer suitability of resist, adhesion of resist to a substrate, resist profile, and characteristics generally required for resist, such as resolution, heat resistance and sensitivity.

In the acid-decomposable resin, the suitable proportion of the repeating units (A3) is from 5 to 65 mole %, preferably from 10 to 60 mole %, particularly preferably from 15 to 55 mole %, of the total repeating units.

In the acid-decomposable resin, the suitable proportion of the repeating units (A1) (preferably, the repeating units represented by formula (I)) is from 5 to 30 mole %, preferably from 10 to 28 mole %, particularly preferably from 15 to 25 mole %, of the total repeating units.

In the acid-decomposable resin, the suitable proportion of the repeating units (A2) (preferably, the repeating units having a partial structure containing an alicyclic hydrocarbon represented by any of formulae (pI) to (pVI)) is from 24 to 55 mole %, preferably from 26 to 50 mole %, particularly preferably from 28 to 45 mole %, of the total repeating units.

And the proportion of repeating units derived from the other comonomers in the acid-decomposable resin can be determined appropriately depending on the desired resist performances. In general, the suitable proportion of such repeating units to the total mole number of the repeating units (A3), the repeating units (A2) and the repeating units (A1) is 99 mole % or below, preferably 90 mole % or below, particularly preferably 80 mole % or below.

The acid-decomposable resins usable in the invention can be synthesized by a conventional method (e.g., a radical polymerization method). In a general synthesis method, for instance, monomer species are placed in a reaction vessel collectively or intermittently, dissolved and homogenized, if needed, in a solvent, e.g., an ether such as tetrahydrofuran, 1,4-dioxane or diisopropyl ether, a ketone such as methyl ethyl ketone or methyl isobutyl ketone, an ester solvent such as ethyl acetate, or a solvent capable of dissolving the present composition, such as propylene glycol monomethyl ether acetate, which is described hereinafter, and then the polymerization thereof is initiated by use of a commercially available radical initiator (e.g., azo initiator, peroxide) in an atmosphere of inert gas such as nitrogen or argon and, if needed, under heating. The additional initiator is added by the lump or in several portions, if required. At the conclusion of the reaction, the reaction mixture is poured into a solvent, and the intended polymer is recovered therefrom by a powder or solid recovery method. The concentration of the reaction solution is at least 20 weight %, preferably at least 30 weight %, particularly preferably at least 40 weight %. The reaction temperature is from 10° C. to 150° C., preferably from 30° C. to 120° C., particularly preferably from 50° C. to 100° C.

The resins relating to the invention have weight average molecular weight of 1,000 to 200,000 as measured by GPC and calculated in terms of polystyrene. It is not much desirable for those resins to have weight average molecular weight lower than 1,000, because deterioration of thermal resistance and dry etching resistance is observed in the resultant resist. When the resins have weight average molecular weight higher than 200,000, they are responsible for not very good results including lowering of developability and deterioration in film formability due to its too high viscosity.

The suitable dispersion degree (Mw/Mn) of resins relating to the invention is from 1.4 to 3.5, preferably from 1.5 to 3.3, particularly preferably from 1.7 to 2.8.

The suitable proportion of the total resins relating to the invention in the present positive resist composition, are 40 to 99.99%, preferably 50 to 99.97%, of the total solid ingredients in the resist.

[2] Compound (B) Capable of Generating an Acid upon Irradiation with an Actinic Ray or a Radiation (Photo-acid Generator):

The photo-acid generator used in the invention is a compound capable of generating an acid when irradiated with an actinic ray or a radiation.

The compounds used as photo-acid generators in the invention can be selected appropriately from photo-initiators for cationic photo-polymerization, photo-initiators for radical photo-polymerization, photo-decoloring agents for dyes, photo-discoloring agents, known compounds capable of generating acids when irradiated with light (400–200 nm ultraviolet rays, far ultraviolet rays, especially g-ray, h-ray, i-ray and KrF excimer laser light), ArF excimer laser light, electron beams, X-ray, molecular beam or ion beam, or mixtures of two or more thereof.

Examples of other photo-acid generators usable in the invention include onium salts, such as diazonium salts, ammonium salts, phosphonium salts, iodonium salts, sulfonium salts, selenonium salts and arsonium salts; organic halogen compounds; organometallic/halogenated organic compounds; photo-acid generators having protective groups of o-nitrobenzyl type; compounds generating sulfonic acid by photolysis as represented by iminosulfonate; disulfone compounds, diazoketosulfone; and diazodisulfone compounds.

In addition, polymers having main or side chains into which those groups or compounds capable of generating photo-acids are introduced can also be employed.

Further, the compounds generating acids under the action of light as described in V. N. R. Pillai, *Synthesis*, (1), 1 (1980), A. Abad et al., *Tetrahedron Lett.*, (47) 4555 (1071), D. H. R. Barton et al., *J. Chem. Soc.*, (C), 329 (1970), U.S. Pat. No. 3,779,773 and European Patent 126,712 can be used, too.

Of the compounds generating acids through decomposition by irradiation with an actinic ray or radiation, photo-acid generators which can produce especially good effects when used in combination are illustrated below.

(1) Trihalomethyl-substituted oxazole or s-triazine derivatives represented by formula (PAG1) or formula (PAG2) respectively:

(PAG1)

(PAG2)

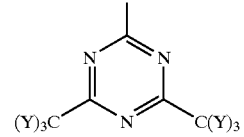

wherein $R_{201}$ represents a substituted or unsubstituted aryl or alkenyl group; $R_{202}$ represents a substituted or unsubstituted aryl, alkenyl or alkyl group, or —$C(Y)_3$; and Y represents a chlorine or bromine atom.

The following compounds are examples of those derivatives, but these exemplified compounds should not be construed as limiting the scope of photo-acid generators usable in the invention.

(PAG1-1) 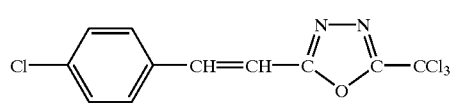
(PAG1-2) 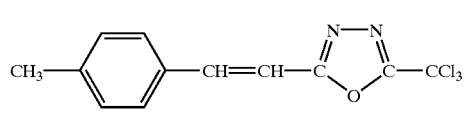
(PAG2-3) 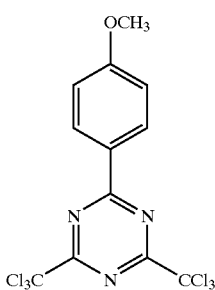
(PAG1-3) 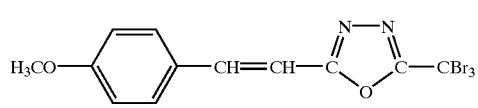
(PAG2-4) 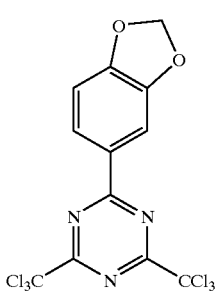
(PAG1-4) 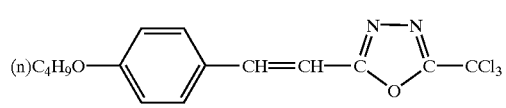
(PAG1-5) 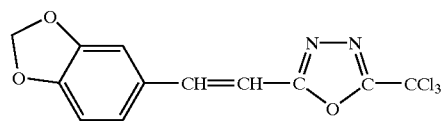
(PAG2-5) 
(PAG1-6) 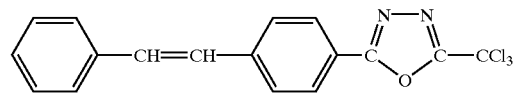
(PAG1-7) 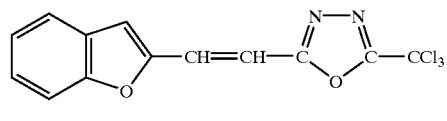
(PAG2-6) 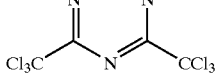
(PAG1-8) 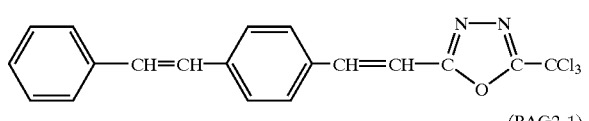
(PAG2-1) 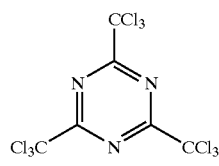
(PAG2-2) 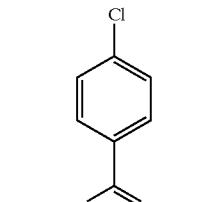
(PAG2-7) 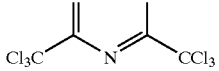

-continued

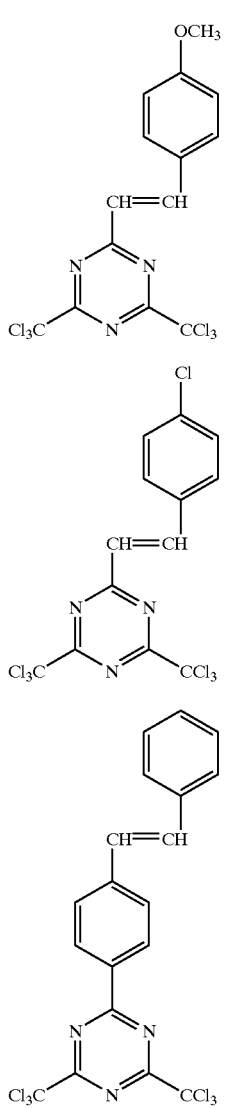

(PAG2-8)

(PAG2-9)

(PAG2-10)

(2) Iodonium salts represented by the following formula (PAG3), or sulfonium salts represented by the following formula (PAG4):

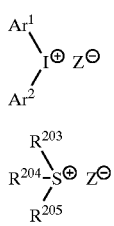

(PAG3)

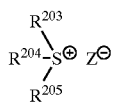

(PAG4)

Herein, $Ar^1$ and $Ar^2$ independently represent a substituted or unsubstituted aryl group, and $R^{203}$, $R^{204}$ and $R^{205}$ independently represent a substituted or unsubstituted alkyl or aryl group.

$Z^-$ represents a counter ion, with examples including $BF_4^-$, $AsF_6^-$, $PF_6^-$, $SbF_6^-$, $SiF_6^{2-}$, $ClO_4^-$, perfluoroalkanesulfonic acid anions such as $CF_3SO_3^-$, condensed polynuclear aromatic sulfonic acid anions such as pentafluorobenzenesulfonic acid anion and naphthalene-1-sulfonic acid anion, anthraquinonesulfonic acid anion and dyes containing sulfonic acid groups. However, the counter anion of $Z^-$ should not be construed as being limited to those examples.

In addition, any two of $R^{203}$, $R^{204}$ and $R^{205}$, and $Ar^1$ and $Ar^2$ may be combined with each other via their respective single bonds or substituent groups.

Examples of those onium salts are illustrated below, but these exemplified compounds should not be construed as limiting the scope of photo-acid generators usable in the invention.

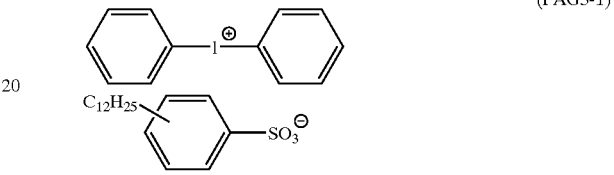

(PAG3-1)

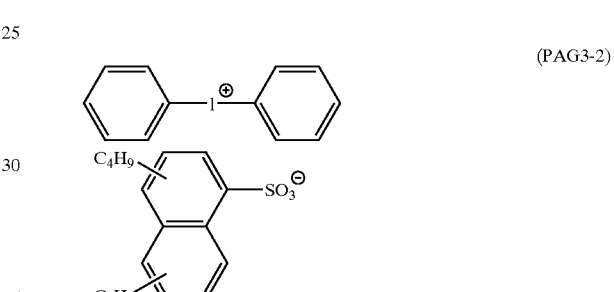

(PAG3-2)

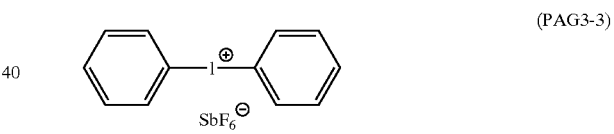

(PAG3-3)

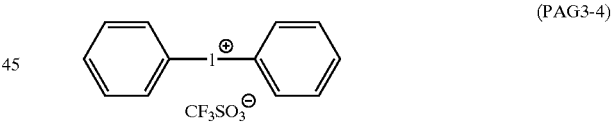

(PAG3-4)

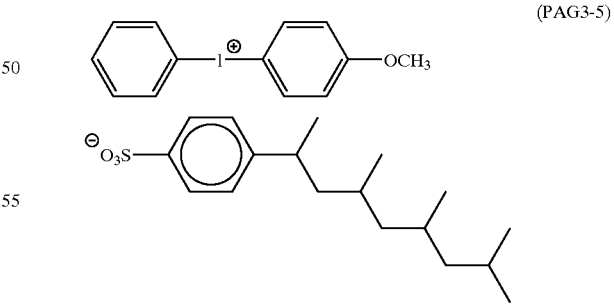

(PAG3-5)

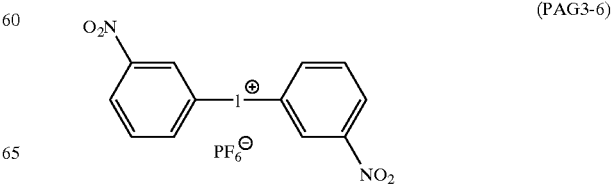

(PAG3-6)

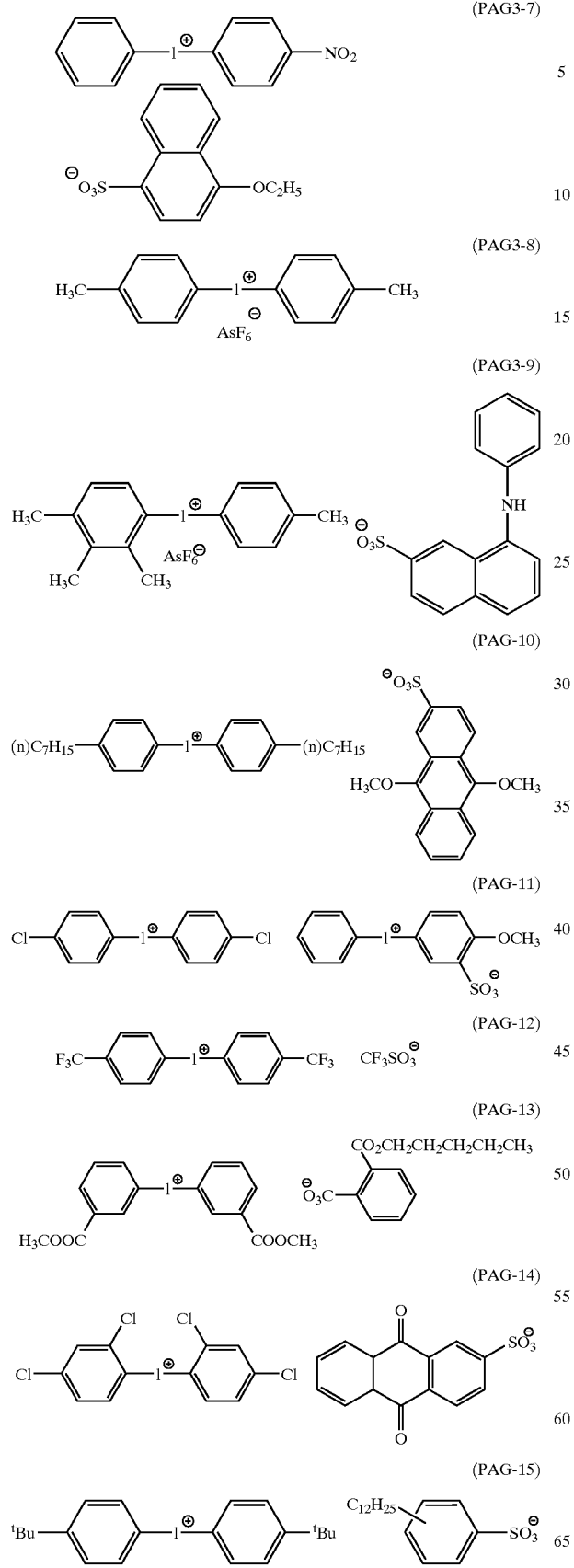

-continued
(PAG3-24)
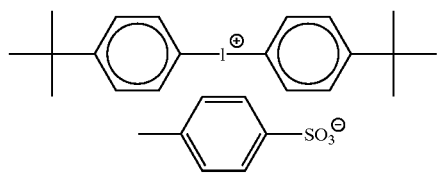
(PAG3-25)
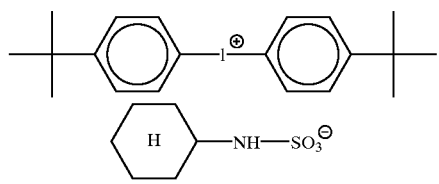
(PAG4-1)
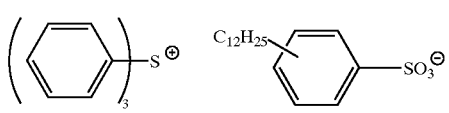
(PAG4-2)
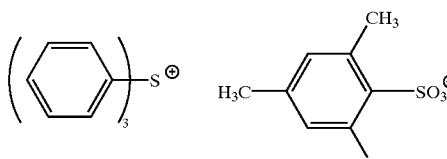
(PAG4-3)
(PAG4-4)
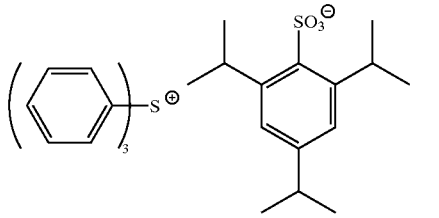
(PAG4-5)
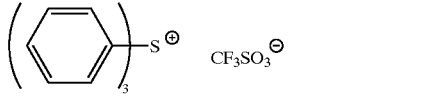
(PAG4-6)
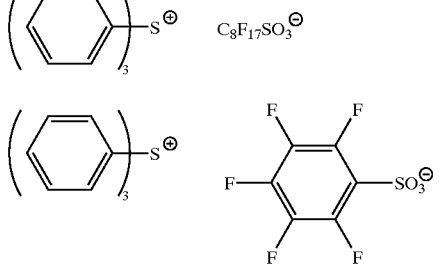
(PAG4-7)
(PAG4-8)
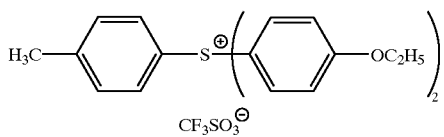
-continued
(PAG4-9)
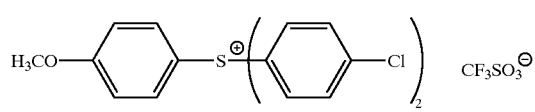
(PAG4-10)
(PAG4-11)
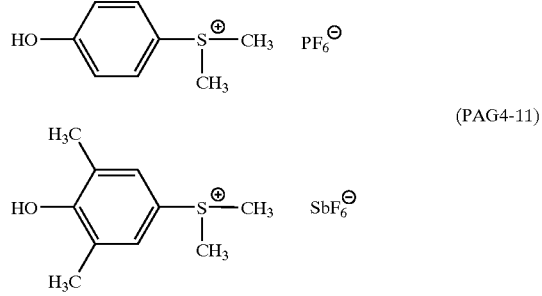
(PAG4-12)
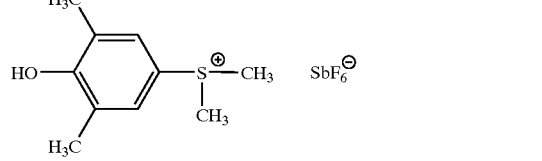
(PAG4-13)
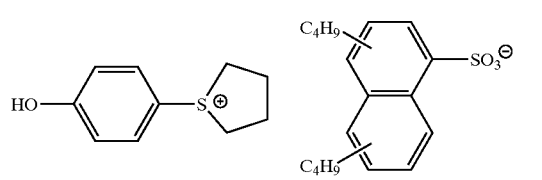
(PAG4-14)
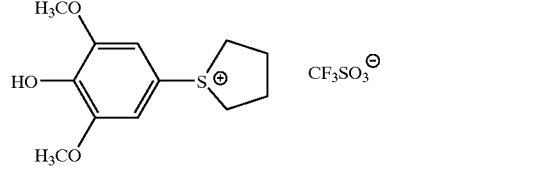
(PAG4-15)
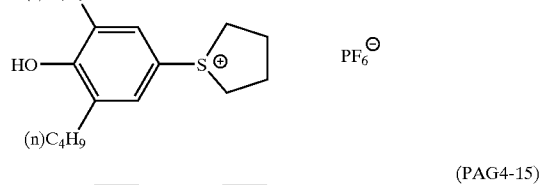
(PAG4-16)
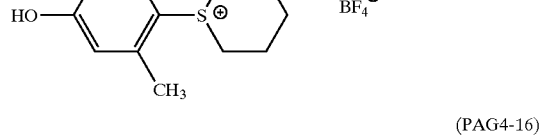
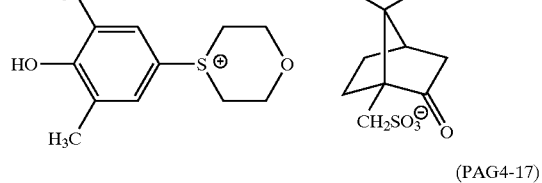
(PAG4-17)
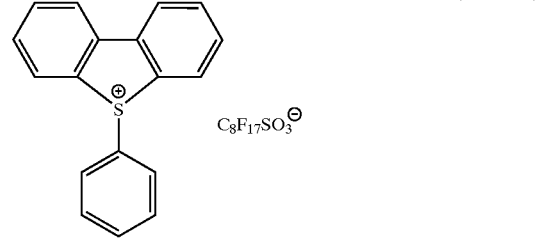

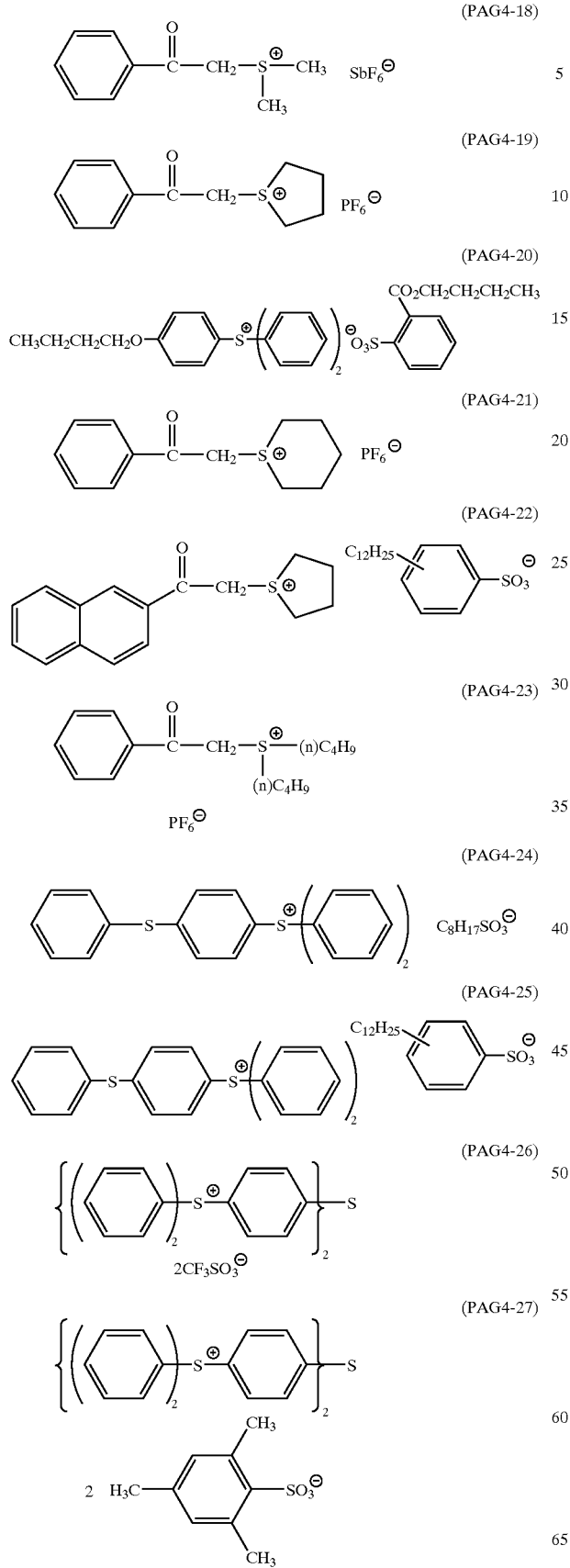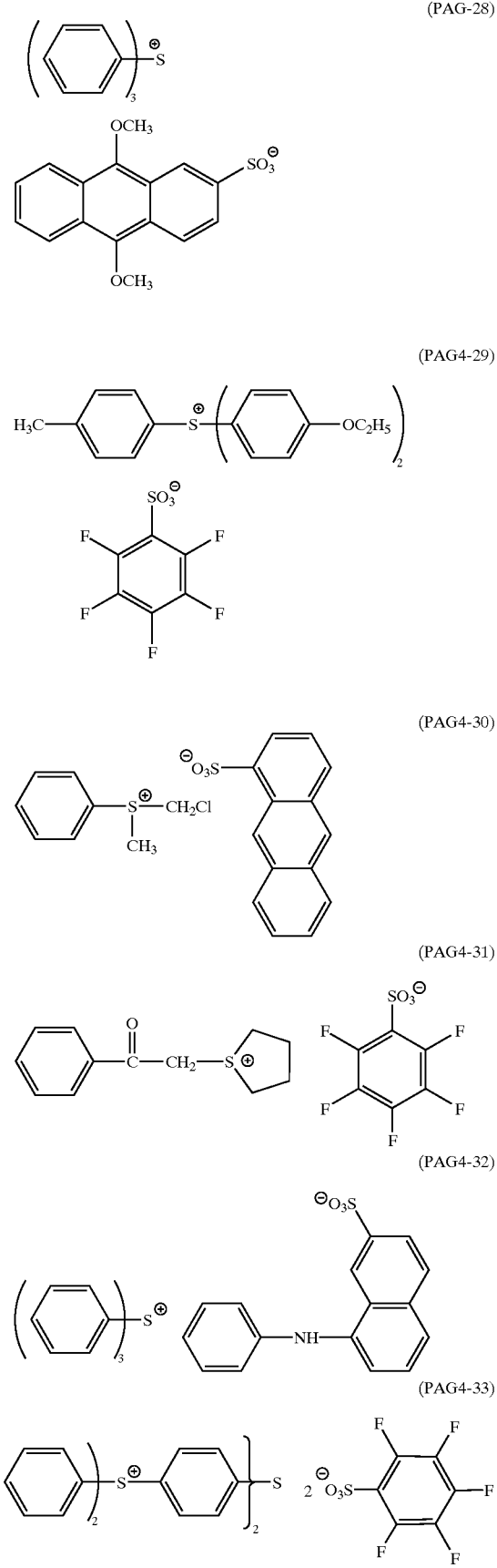

(PAG4-34)
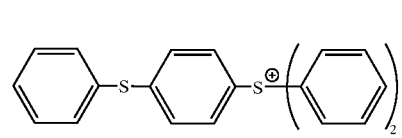
(PAG4-35)
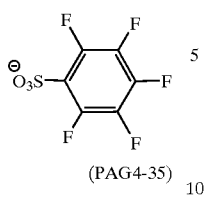
(PAG4-36)
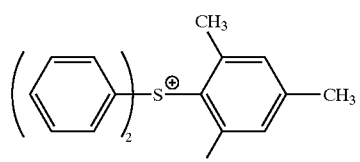
PAG4-37
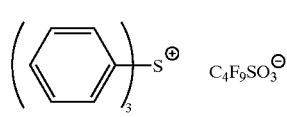
(PAG4-38)
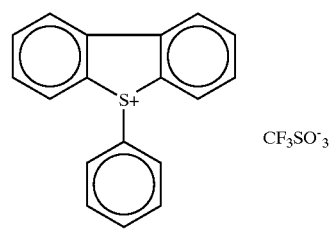
(PAG4-39)
(PAG4-40)
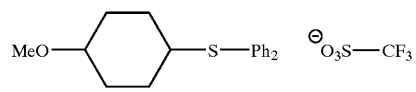
(PAG4-41)
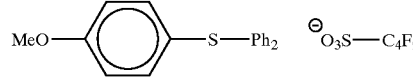
(PAG4-42)
(PAG4-43)
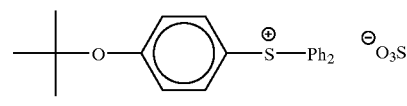
(PAG4-44)
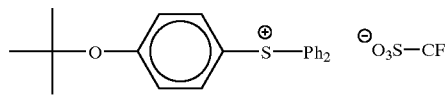
(PAG4-45)
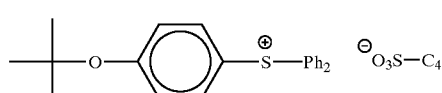
(PAG4-46)
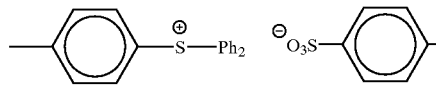
(PAG4-47)
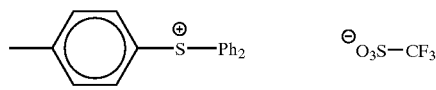
(PAG4-48)
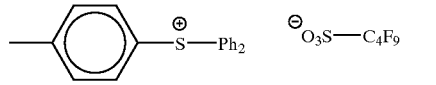
(PAG4-49)
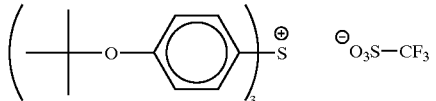
(PAG4-50)
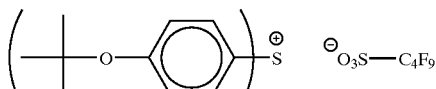
(PAG4-51)
(PAG4-52)
(PAG4-53)
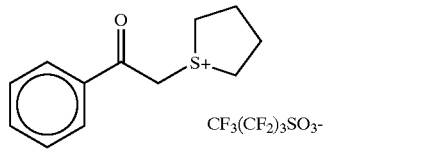
(PAG4-54)
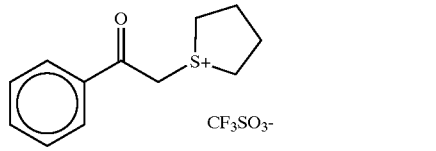
(PAG4-55)
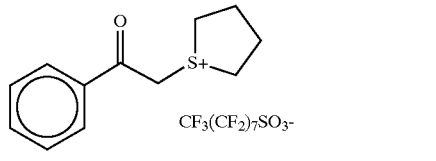

-continued
(PAG4-56)
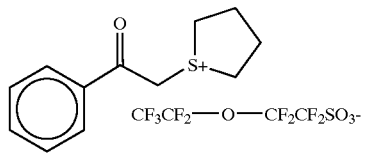
(PAG4-57)
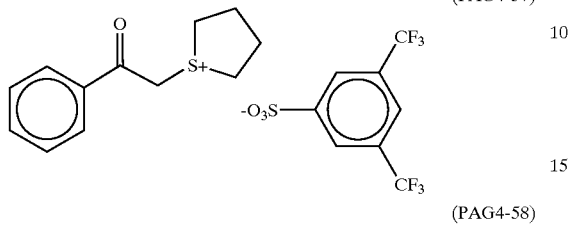
(PAG4-58)
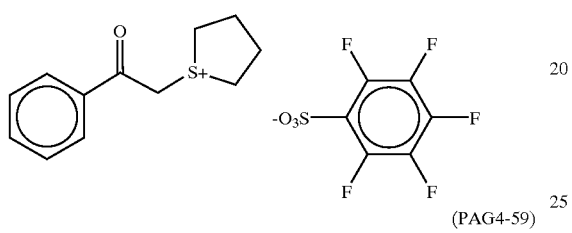
(PAG4-59)
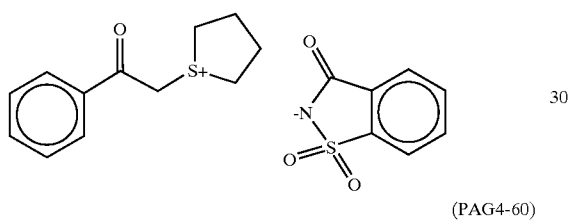
(PAG4-60)
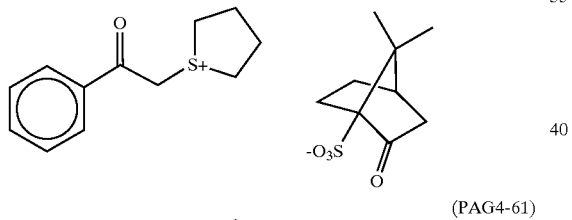
(PAG4-61)
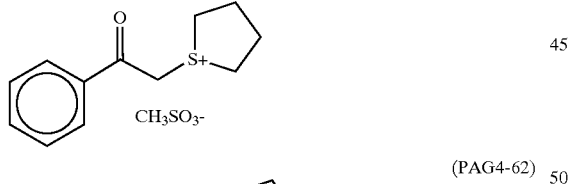
(PAG4-62)
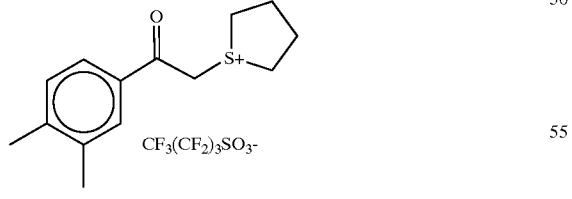
(PAG4-63)
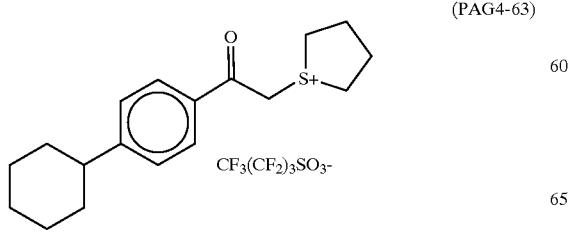
-continued
(PAG4-64)
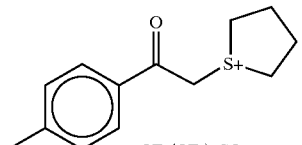
(PAG4-65)
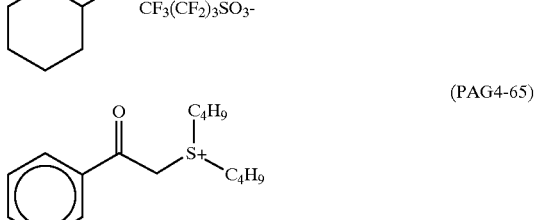
(PAG4-66)
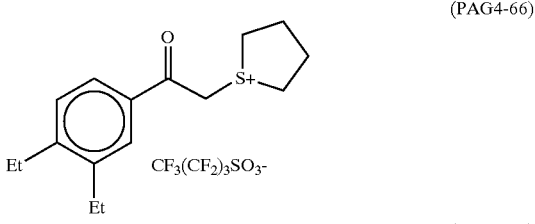
(PAG4-67)
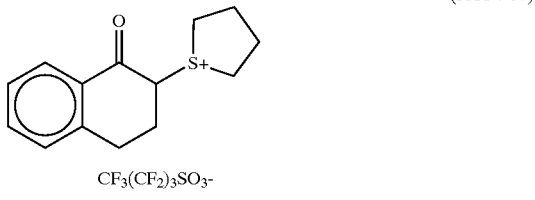
(PAG4-68)
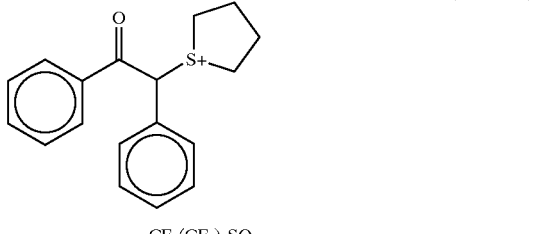
(PAG4-69)
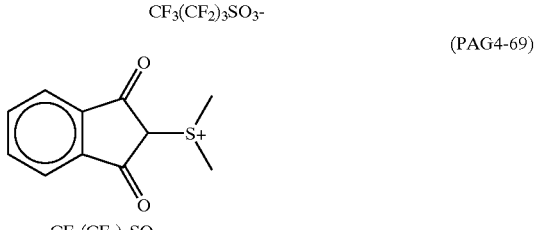
(PAG4-70)
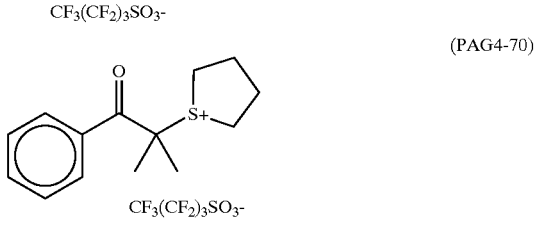
(PAG4-71)
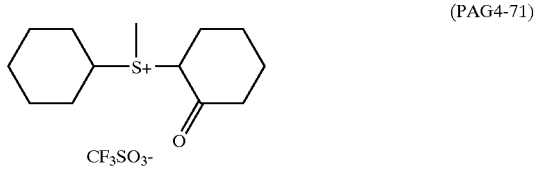

-continued
(PAG4-72)
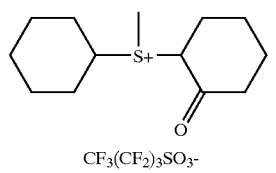
(PAG4-73)
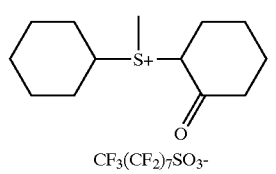
(PAG4-74)
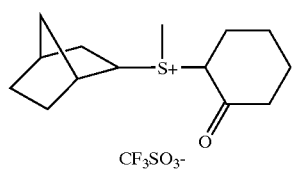
(PAG4-75)
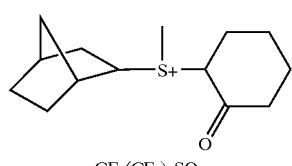
(PAG4-76)
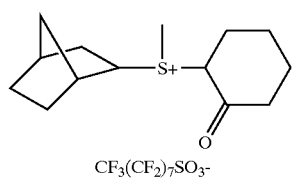
(PAG4-77)
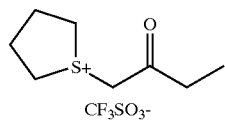
(PAG4-78)
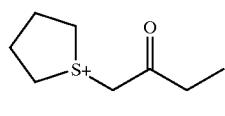
(PAG4-79)
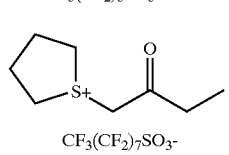
(PAG4-80)
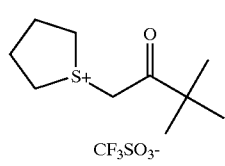
(PAG4-81)
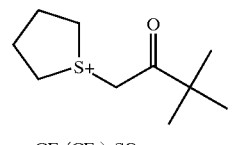
(PAG4-82)
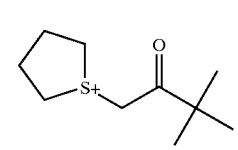
(PAG4-83)
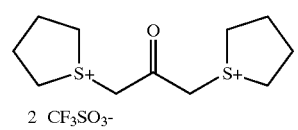
(PAG4-84)
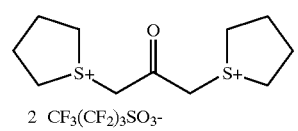
(PAG4-85)
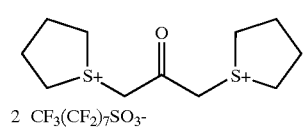
(PAG4-86)
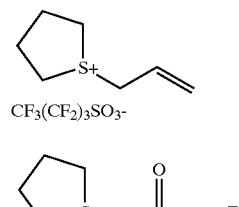
(PAG4-87)
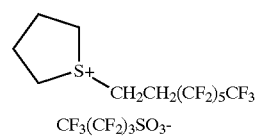
(PAG4-88)
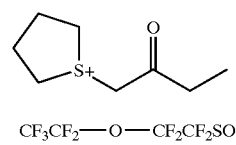
(PAG4-89)
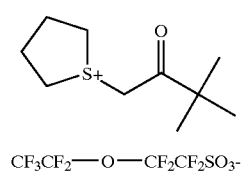
(PAG4-90)

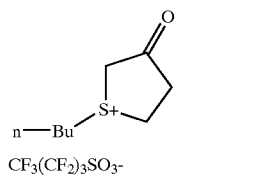
(PAG4-91)

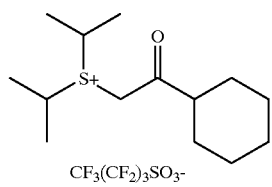
(PAG4-92)

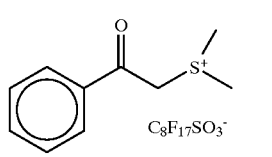
(PAG4-93)

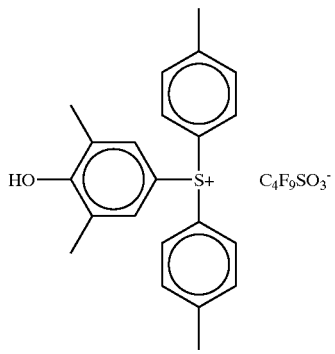
(PAG4-94)

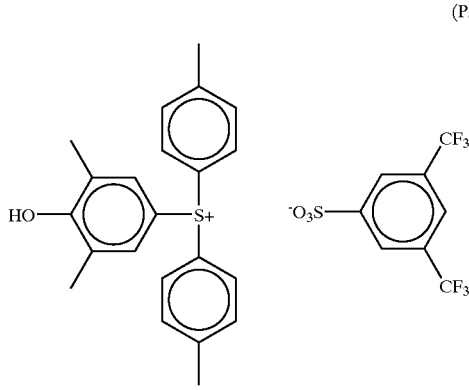
(PAG4-95)

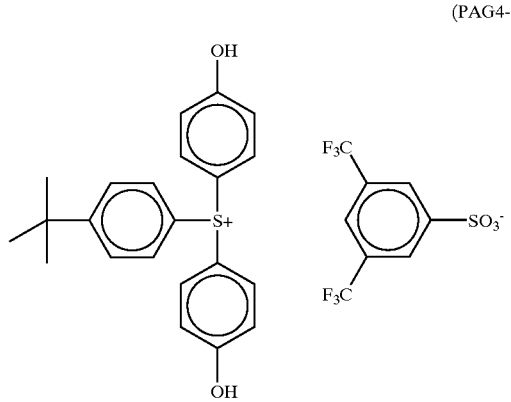
(PAG4-96)

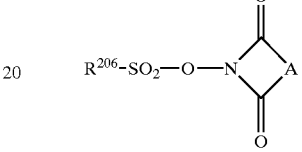

In the structural formulae illustrated above, Ph stands for a phenyl group.

The onium salts represented by formulae (PAG3) and (PAG4) respectively are known compounds, and can be synthesized using the methods as disclosed in U.S. Pat. Nos. 2,807,648 and 4,247,473, and Japanese Patent Laid-Open No. 101331/1978.

(3) Disulfone derivatives represented by the following formula (PAG5), or iminosulfonate derivatives represented by the following formula (PAG6):

$$Ar^3-SO_2-SO_2-Ar^4 \quad \text{(PAG5)}$$

(PAG6)

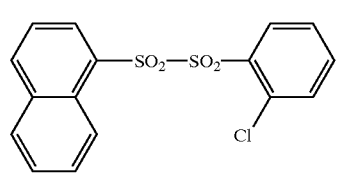

In the above formulae, $Ar^3$ and $Ar^4$ independently represent a substituted or unsubstituted aryl group, $R^{206}$ represents a substituted or unsubstituted alkyl or aryl group, and A represents a substituted or unsubstituted alkylene, alkenylene or arylene group.

Examples of those derivatives are illustrated below, but these exemplified compounds should not be construed as limiting the scope of photo-acid generators usable in the invention.

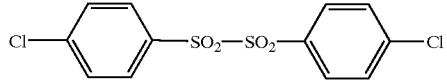
(PAG5-1)

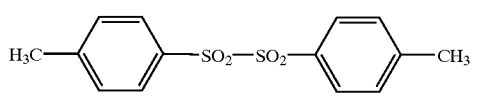
(PAG5-2)

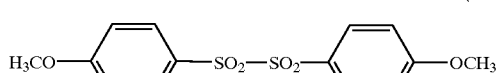
(PAG5-3)

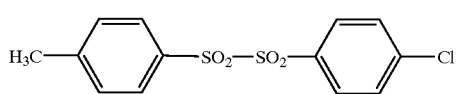
(PAG5-4)

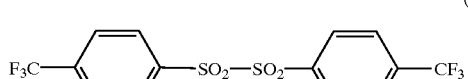
(PAG5-5)

(PAG5-6)

-continued
(PAG5-7)
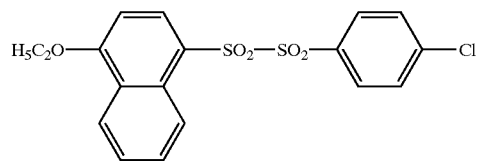
(PAG5-8)
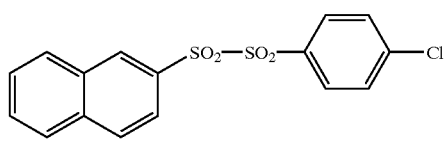
(PAG5-9)
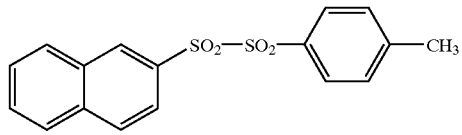
(PAG5-10)
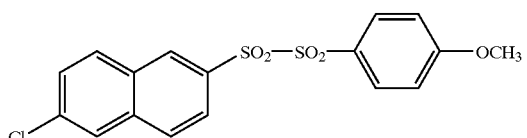
(PAG5-11)
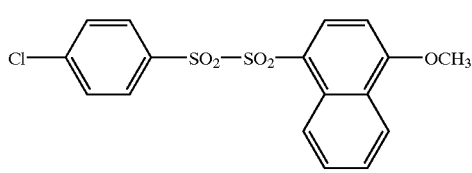
(PAG5-12)
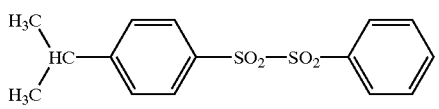
(PAG5-13)
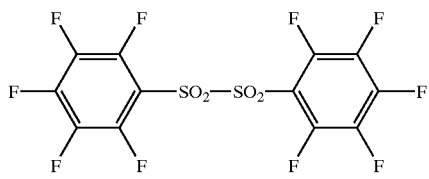
(PAG5-14)
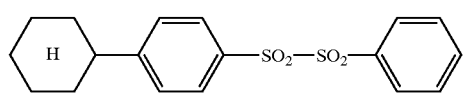
(PAG5-15)
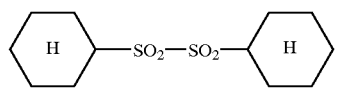
(PAG6-1)
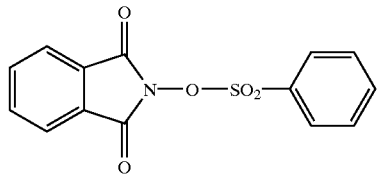
-continued
(PAG6-2)
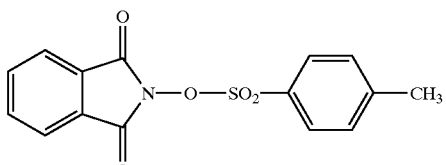
(PAG6-3)
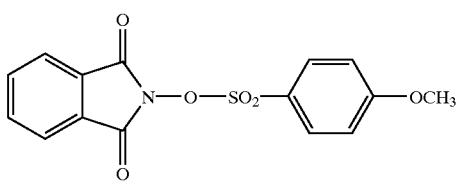
(PAG6-4)
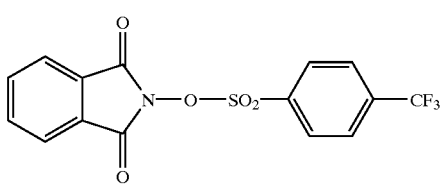
(PAG6-5)
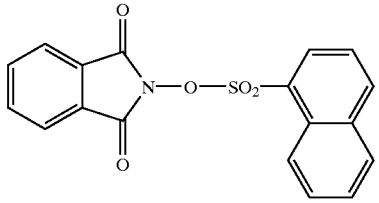
(PAG6-6)
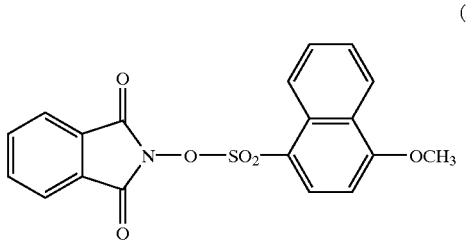
(PAG6-7)
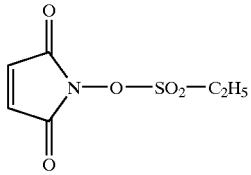
(PAG6-8)
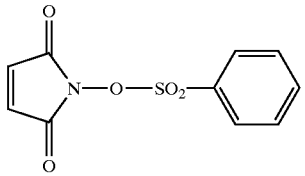
(PAG6-9)
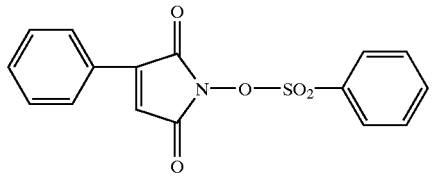

-continued (PAG6-10)
(PAG6-11)
(PAG6-12)
(PAG6-13)
(PAG6-14)
(PAG6-15)
(PAG6-16)
(PAG6-17)

-continued (PAG6-18)
(PAG6-19)
(PAG6-20)
(PAG6-21)
(PAG6-22)
(PAG6-23)
(PAG6-24)
(PAG6-25)
(PAG6-26)

(PAG6-27)
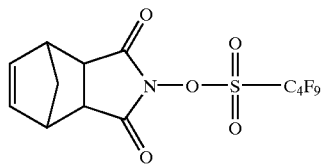

(PAG6-28)
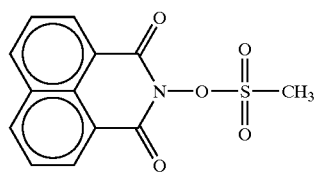

(PAG6-29)
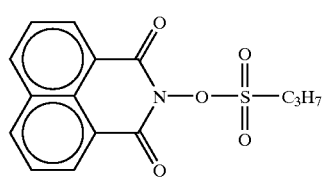

(PAG6-30)
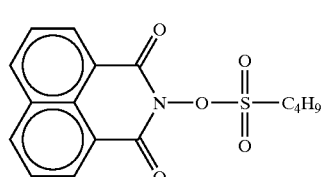

(PAG6-31)
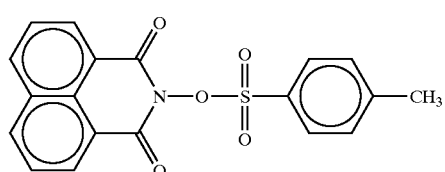

(PAG6-32)
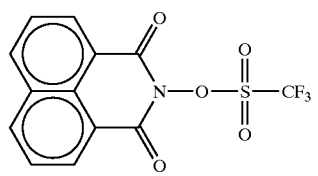

(PAG6-33)
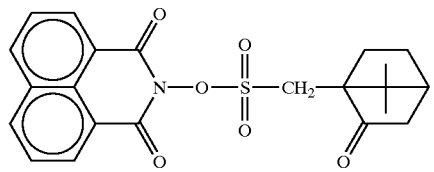

(PAG6-34)
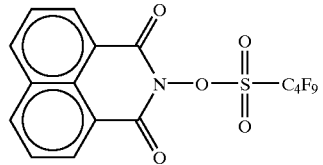

(4) Diazodisulfone derivatives represented by the following formula (PAG7):

(PAG7)
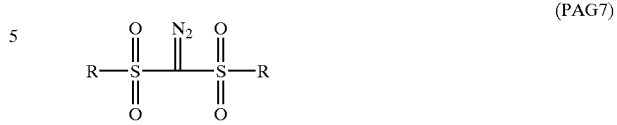

Herein, R represents a linear, branched or cyclic alkyl group, or an unsubstituted or substituted aryl group.

The following are examples of those derivatives, but these exemplified compounds should not be construed as limiting the scope of photo-acid generators usable in the invention.

(PAG7-1)
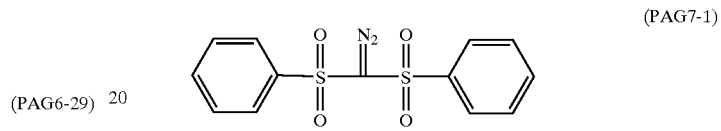

(PAG7-2)
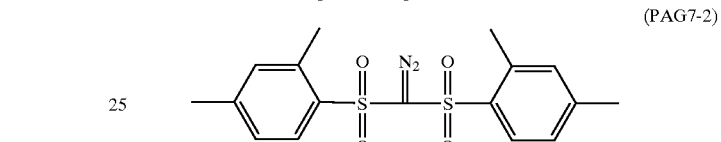

(PAG7-3)
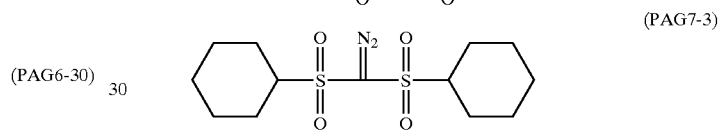

(PAG7-4)
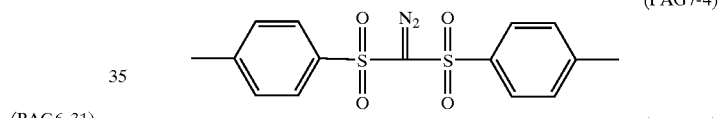

(PAG7-5)
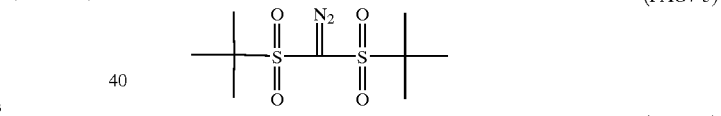

(PAG7-6)
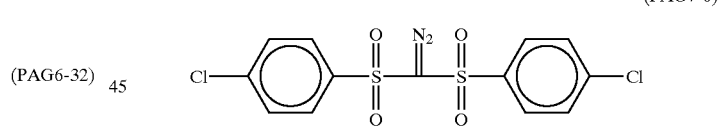

(PAG7-7)
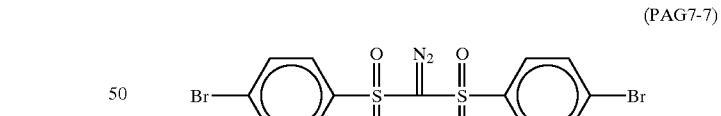

(PAG7-8)
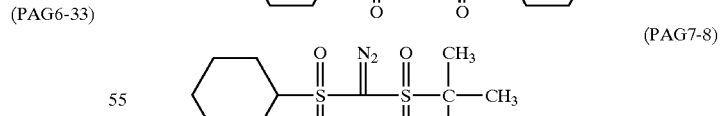

(PAG7-9)
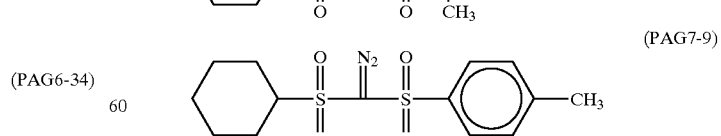

Those photo-acid generators are added in a proportion of generally from 0.01 to 30 weight %, preferably from 0.3 to 20 weight %, particularly preferably from 0.5 to 10 weight %, to the total solids in the resist composition.

When the proportion of photo-acid generators added is lower than 0.01 weight %, the resist sensitivity shows a tendency to decrease. On the other hand, when the proportion is greater than 30 weight %, the resultant resist shows too strong absorption of light, and so the resist profile tends to deteriorate and the process margin (especially bake margin) tends to narrow.

[3] Other Additives:

The present positive resist composition can further contain acid-decomposable dissolution-inhibiting compounds, dyes, plasticizers, surfactants, photo-sensitizers, organic basic compounds and compounds capable of promoting dissolution in developers, if needed.

It is advantageous for the present positive resist composition to further contain [C] a surfactant containing fluorine and/or silicon atoms.

In other words, any of a fluorine-containing surfactant a silicon-containing surfactant and a surfactant containing both fluorine and silicon atoms, or a combination of at least two of them is preferably contained as Component [C] of the present composition.

Using the acid-decomposable resin in combination with the surfactant in the present positive resist composition is particularly effective in the case where the patterns to be formed have ever-finer line widths, and can bring about further improvement in development defects.

Examples of such surfactants include the surfactants as disclosed in Japanese Patent Laid-Open Nos. 36663/1987, 226746/1986, 226748/1986, 170950/1987, 34540/1988, 230165/1995, 62834/1996, 54432/1997 and 5988/1997, and U.S. Pat. Nos. 5,405,720, 5,360,682, 5,529,881, 5,296,330, 5,436,098, 5,576,143, 5,294,511 and 5,824,451. In addition, the following commercially available surfactants can be used as they are. Examples of commercial surfactants usable as fluorine- or silicone-containing ones include Eftop EF301 and EF303 (produced by Shin-Akita Kasei K.K.), Florad FC430 and FC431 (produced by Sumitomo 3M, Inc.), Megafac F171, F173, F176, F189 and R08 (produced by Dainippon Ink & Chemicals, Inc.), Surflon S-382, SC101, SC102, SC103, SC104, SC105 and SC106 (produced by Asahi Glass Co., Ltd.), and Troysol S-366 (produced by Troy Chemical Industries, Inc.). Further, organosiloxane polymer KP-341 (produced by Shin-Etsu Chemical Industry Co., Ltd.) can be used as a silicon-containing surfactant.

The surfactants are mixed in a proportion of generally from 0.001 to 2 weight %, preferably from 0.01 to 1 weight %, to the total solids in the present composition. Those surfactants may be added alone, or some of them can be added in combination.

In addition to the surfactants as recited above, nonionic surfactants are also usable in the invention. Examples of usable nonionic surfactants include polyoxyethylene alkyl ethers, such as polyoxyethylene lauryl ether, polyoxyethylene stearyl ether, polyoxyethylene cetyl ether and polyoxyethylene oleyl ether; polyoxyethylene alkyl aryl ethers, such as polyoxyethylene octyl phenol ether and polyoxyethylene nonyl phenol ether; polyoxyethylene-polyoxypropylene block copolymers; sorbitan fatty acid esters, such as sorbitan monolaurate, sorbitan monopalmitate, sorbitan monostearate, sorbitan trioleate and sorbitan tristearate; and polyoxyethylenesorbitan fatty acid esters, such as polyoxyethylenesorbitan monolaurate, polyoxyethylenesorbitan monopalmitate, polyoxyethylenesorbitan monostearate, polyoxyethylenesorbitan trioleate and polyoxyethylenesorbitan tristearate.

Those surfactants are mixed in an amount of at most 2 parts by weight, preferably at most 1 parts by weight, per 100 parts by weight of total solids in the present composition.

The organic basic compounds which can be appropriately mixed as Component [D] in the present composition are compounds having stronger basicity than phenol. Of such compounds, nitrogen-containing basic compounds is preferable, and the compounds containing a structure represented by the following structural formulae (A) to (E) are more preferable.

(A)

In the above formula (A), $R^{250}$, $R^{251}$ and $R^{252}$ independently represent a hydrogen atom, a 1–6C alkyl group, a 1–6C aminoalkyl group, a 1–6C hydroxyalkyl group, or a substituted or unsubstituted 6–20C aryl group. Further, $R^{250}$ and $R^{251}$ may combine with each other to form a ring.

(B)

(C)

(D)

(E)

In the formula (E), $R^{253}$, $R^{254}$, $R^{255}$ and $R^{256}$ independently represent a 1–6C alkyl group.

More appropriately usable compounds are nitrogen-containing basic compounds which each have at least two nitrogen atoms of different chemical environments. Particularly preferred compounds are compounds which each contain both substituted or unsubstituted amino group and nitrogen-containing ring structure, or compounds containing alkyl amino groups.

Examples of such compounds include a substituted or unsubstituted guanidine, a substituted or unsubstituted aminopyridine, a substituted or unsubstituted aminoalkylpyridine, a substituted or unsubstituted aminopyrrolidine, a substituted or unsubstituted indazole, a substituted or unsubstituted pyrazole, a substituted or unsubstituted pyrazine, a substituted or unsubstituted pyrimidine, a substituted or unsubstituted purine, a substituted or unsubstituted imidazoline, a substituted or unsubstituted pyrazoline, a substituted or unsubstituted piperazine, a substituted or unsubstituted amino morpholine, and a substituted or unsubstituted aminoalkylmorpholine, mono-, di- and tri-alkylamines, substituted or unsubstituted aniline, substituted or unsubstituted piperidine. As examples of substituents the above-recited compounds can suitably have, mention may be made of an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxyl group and a cyano group.

Suitable examples of nitrogen-containing basic compounds include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethyl-piperidine, 4-piperidinopiperidine, 2-iminopiperidine, 1-(2-aminoethyl) pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, N-(2-aminoethyl)morpholine, 1,5-diazobicyclo[4.3.0]nona-5-ene, 1,8-diazabicyclo[5.4.0]-undeca-7-ene, 1,4-diazabicyclo[2.2.2]octane, 2,4,5-triphenylimidazole, N-methylmorpholine, N-ethylmorpholine, N-hydroxyethylmorpholine, N-benzylmorpholine, a tertiary morpholine derivative such as cyclohexylmorpholino-ethylthiourea (CHMETU), and the hindered amines as disclosed in Japanese Patent Laid-Open 52575/1999 (e.g., those described in paragraph [0005]). However, these examples should not be construed as limiting the scope of the basic compounds usable in the invention.

In particular, 1,5-diazabicyclo[4.3.0]nona-5-ene, 1,8-diazabicyclo[5.4.0]undeca-7-ene, 1,4-diazabicyclo-[2.2.2] octane, 4-dimethylaminopyridine, hexamethylenetetramine, 4,4-dimethylimidazoline, pyrroles, pyrazoles, imidazoles, pyridazines, pyrimidines, tertiary morpholines such as CHMETU, and hindered amines such as bis(1,2,2, 6,6-pentamethyl-4-piperidyl)sebacate are favorable.

Of these compounds, 1,5-diazabicyclo[4.3.0]nona-5-ene, 1,8-diazabicyclo[5.4.0]undeca-7-ene, 1,4-diazabicyclo-[2.2.2]octane, 4-dimethylaminopyridine, hexamethyltetramine, CHMETU and bis(1,2,2,6,6-pentamethyl-4-piperidyl)sebacate are preferred over the others.

These basic compounds [D] may be used alone or as mixtures of two or more thereof. The basic compounds are used in a proportion generally from 0.001 to 10 weight %, preferably from 0.01 to 5 weight %, to the total solids in the positive resist composition. The effect of the foregoing basic compounds cannot be produced when the compounds are added in a proportion lower than 0.001 weight %. On the other hand, the addition in a proportion higher than 10 weight % tends to cause a decrease in sensitivity and deterioration of developability in the unexposed areas.

The present positive resist composition is dissolved in a solvent capable of dissolving the ingredients as mentioned above, and coated on a substrate. Examples of a solvent usable herein include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethylacetate, ethylene glycol monomethyl ether acetate, propylene glycol monomethyl ether, propylene glycol monomethyl ether acetate (PGMEA), toluene, ethyl acetate, butyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone, and tetrahydrofuran. These solvents are used alone or as mixtures.

Of the solvents recited above, propylene glycol monomethyl ether acetate, 2-heptanone, γ-butyrolactone, ethylene glycol monomethyl ether, ethylene glycol monoethyl ether, ethylene glycol monomethyl ether acetate, propylene glycol monomethyl ether, propylene glycol monoethyl ether, butyl acetate, methyl lactate, ethyl lactate, methyl methoxypropionate, ethyl ethoxypropionate, N-methylpyrrolidone and tetrahydrofuran are preferred over the others.

The present positive resist composition dissolved in an appropriate solvent is coated on a substrate and forms a thin film. The suitable thickness of the coating film is from 0.2 to 1.2 μm.

Examples of an inorganic substrate usable in the invention include a usual bare Si substrate, an SOG substrate and substrates having the following inorganic antireflective coatings. Further, commercially available inorganic or organic antireflective coatings may be used in the invention, if needed.

Examples of an antireflective coating usable in the invention include inorganic coatings formed of titanium, titanium dioxide, titanium nitride, chromium oxide, carbonand α-silicon, respectively, and organic coatings made up of light absorbent/polymer material combinations. The inorganic coatings require equipment for formation thereof, such as a vacuum evaporator, CVD apparatus and sputtering apparatus. Examples of an organic antireflective coating usable in the invention include the coating disclosed in Japanese Patent Publication No. 69611/1995, which is made up of a condensation product of a diphenylamine derivative and a formaldehyde-modified melamine resin, an alkali-soluble resin and a light absorbent; the coating disclosed in U.S. Pat. No. 5,294,680, which is made up of the reaction product of a maleic anhydride copolymer and a light absorbent of diamine type; the coating disclosed in Japanese Patent Laid-Open No. 118631/1994, which contains a resin binder and a thermal crosslinking agent of methylolmelamine type; the coating disclosed in Japanese Patent Laid-Open No. 118656/1994, which is made up of an acrylic resin containing carboxylic, epoxy and light-absorbing groups in every molecule; the coating disclosed in Japanese Patent Laid-Open No. 87115/1996, which is made up of methylolmelaine and a light absorbent of benzophenone type; and the coating disclosed in Japanese Patent Laid-Open No. 179509/1996, which is made up of a low molecular light absorbent-added polyvinyl alcohol resin. In addition, DUV 300 series, DUV-40 series and ARC 25 produced by Brewer Science Inc. and AC-2, AC-3, AR19 and AR29 produced by Shipley Inc. can also be used as organic antireflective coatings.

The resist solution is coated on a substrate as used for production of precision-integrated circuit elements (e.g., silicon/silicon dioxide film), which is provided with the antireflective coating as recited above, if needed, by means of an appropriate coating machine, such as a spinner or a coater. The resist coating thus formed is exposed to light via the desired mask, baked, and then development-processed. In this manner, resist patterns of good quality can be obtained. As the exposure light, light of wavelengths of 150 to 250 nm can be used to advantage. Specifically, KrF excimer laser (248 nm), ArF excimer laser (193 nm), $F_2$ excimer laser (157 nm), X-ray and electron beams are included therein.

Developers usable for development-processing are aqueous alkaline solutions containing inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcoholamines such as dimethylethanolamine and triethanolamine, quaternary ammonium salts such as tetramethylammonium hydroxide and tetraethylammonium hydroxide, or cyclic amines such as pyrrole and piperidine.

To the aqueous alkaline solutions, alcohol and surfactants may further be added in appropriate amounts.

The invention will now be illustrated in more detail by reference to the following examples, but these examples should not be construed as limiting the scope of the invention in any way.

SYNTHESIS EXAMPLE (1)

Synthesis of Resin (1)-1

In a reaction vessel, 2-adamantyl-2-propyl methacrylate (repeating units A2), norbornane lactone acrylate and dihydroxyadamantane methacrylate (repeating units A1) were placed in proportions of 50:40:10, and dissolved in a 9:1 mixture of methyl ethyl ketone and tetrahydrofuran, thereby preparing 450 g of a solution having a solids concentration of 22%. This solution was mixed with 10 mole % of V-601 produced by Wako Pure Chemical Industries, Ltd., and then added dropwise to 40 g of methyl ethyl ketone heated to 65° C. over a period of 6 hours in an atmosphere of nitrogen. After the completion of the addition, the reaction solution was stirred for 4 hours. At the conclusion of the reaction, the resultant solution was cooled to room temperature, and poured into 5 liter of a 3:1 mixture of methanol and isopropyl alcohol. A white powdery matter thus deposited was filtered off, and made into slurry by use of 1 liter of methanol. Thus, the intended Resin (1)-1 was recovered.

The compositional ratio of the monomers in the resin was 46:42:12 (A1/A2=0.26, A1+A2=58 mole %) as determined by NMR. The resin had a weight average molecular weight of 13,100 as measured by GPC and calculated in terms of standard polystyrene, and a dispersion degree Mw/Mn of 2.2.

SYNTHESIS EXAMPLE (2)

Synthesis of Resin (1)-2

In a reaction vessel, 2-adamantyl-2-propylmethacrylate, norbornane lactone acrylate and dihydroxyadamantane methacrylate were placed in proportions of 50:40:10, and dissolved in a 9:1 mixture of methyl ethyl ketone and tetrahydrofuran, thereby preparing 450 g of a solution having a solids concentration of 22%. This solution was mixed with 10 mole % of V-601 produced by Wako Pure Chemical Industries, Ltd., and then added dropwise to 40 g of methyl ethyl ketone heated to 65° C. over a period of 6 hours in an atmosphere of nitrogen. After the completion of the addition, the reaction solution was stirred for 4 hours. At the conclusion of the reaction, the resultant solution was cooled to room temperature, and poured into 5 liter of hexane. A white powdery matter thus deposited was filtered off, dissolved again in tetrahydrofuran, and further re-precipitated with 5 liter of hexane. And the intended Resin (1)-2 was recovered.

The compositional ratio of the monomers in the resin was 46:42:12 (A1/A2=0.26, A1+A2=58 mole %) as determined by NMR. The resin had a weight average molecular weight of 10,200 as measured by GPC and calculated in terms of standard polystyrene, and a dispersion degree Mw/Mn of 3.5.

SYNTHESIS EXAMPLE (3)

Synthesis of Resin (1)-3

In a reaction vessel, 2-adamantyl-2-propyl methacrylate, norbornane lactone acrylate and dihydroxyadamantane methacrylate were placed in proportions of 50:40:10, and dissolved in a 9:1 mixture of methyl ethyl ketone and tetrahydrofuran, thereby preparing 450 g of a solution having a solids concentration of 22%. This solution was mixed with 10 mole % of V-601 produced by Wako Pure Chemical Industries, Ltd., and then added dropwise to 40 g of methyl ethyl ketone heated to 65° C. over a period of 6 hours in an atmosphere of nitrogen. After the completion of the addition, the reaction solution was stirred for 4 hours. At the conclusion of the reaction, the resultant solution was cooled to room temperature, and poured into 5 liter of an 85:15 mixture of hexane and ethyl acetate. A white powdery matter thus deposited was filtered off, dissolved again in tetrahydrofuran, and further re-precipitated with 5 liter of an 85:15 mixture of hexane and ethyl acetate. And the intended Resin (1)-3 was recovered.

The compositional ratio of the monomers in the resin was 45:43:12 (A1/A2=0.27, A1+A2=57 mole %) as determined by NMR. The resin had a weight average molecular weight of 11,300 as measured by GPC and calculated in terms of standard polystyrene, and a dispersion degree Mw/Mn of 2.9.

SYNTHESIS EXAMPLE (4)

Synthesis of Resin (1)-4

The Resin (1)-1 obtained in Synthesis Example (1) was fractionated by chromatography on a column of silica gel. Therein, hexane-acetone mixtures (hexane/acetone ratio: 99/1 to 50/50) were used as developing solvents.

The compositional ratio of the monomers in the resin thus fractionated was 45:43:12 (A1/A2=0.27, A1+A2=57 mole %) as determined by NMR. The resin had a weight average molecular weight of 11,700 as measured by GPC and calculated in terms of standard polystyrene, and a dispersion degree Mw/Mn of 1.4.

Resins (2) to (12), whose compositional ratios between their respective monomers and molecular weights are set forth in Table 1, were each synthesized following the same operational procedures as in Synthesis Examples described above. (The repeating units in Table 1 are numbered following the sequence from the left in each structural formula illustrated hereinafter.)

TABLE 1

| Resin | Repeating unit 1 (A2) mole % | Repeating unit 2 (alicyclic lactone unit) mole % | Repeating unit 3 (Al) mole % | Repeating unit 4 mole % | A1/A2 | A1 + A2 mole % | Weight average molecular weight | Dispersion degree MW/Mn |
|---|---|---|---|---|---|---|---|---|
| (1)-5 | 41 | 39 | 20 | — | 0.49 | 61 | 10600 | 2.4 |
| (1)-6 | 31 | 47 | 22 | — | 0.71 | 53 | 9900 | 2.3 |
| (2)-1 | 52 | 37 | 11 | — | 0.21 | 63 | 12500 | 1.9 |
| (2)-2 | 45 | 36 | 19 | — | 0.42 | 64 | 12100 | 2.4 |
| (2)-3 | 40 | 38 | 22 | — | 0.55 | 62 | 10600 | 2.5 |
| (3)-1 | 36 | 29 | 11 | 24 | 0.31 | 47 | 13400 | 2.0 |
| (3)-2 | 35 | 25 | 18 | 22 | 0.51 | 53 | 13700 | 2.0 |
| (4)-1 | 45 | 28 | 9 | 18 | 0.20 | 54 | 11300 | 1.8 |
| (4)-2 | 39 | 34 | 17 | 10 | 0.44 | 56 | 12100 | 2.2 |
| (4)-3 | 41 | 38 | 12 | 9 | 0.29 | 53 | 10800 | 2.5 |
| (5) | 53 | 27 | 12 | 8 | 0.23 | 65 | 11900 | 1.9 |
| (6)-1 | 50 | 34 | 11 | 5 | 0.22 | 61 | 15800 | 2.5 |
| (6)-2 | 38 | 40 | 21 | 1 | 0.55 | 59 | 13800 | 2.6 |
| (7) | 55 | 30 | 9 | 6 | 0.16 | 64 | 11100 | 1.8 |
| (8) | 37 | 35 | 8 | 20 | 0.22 | 45 | 12600 | 2.1 |
| (9)-1 | 43 | 28 | 14 | 15 | 0.33 | 57 | 13700 | 2.2 |
| (9)-2 | 32 | 43 | 20 | 5 | 0.63 | 52 | 12600 | 2.1 |
| (10)-1 | 47 | 29 | 11 | 13 | 0.23 | 58 | 12200 | 2.1 |
| (10)-2 | 41 | 31 | 18 | 10 | 0.44 | 59 | 10300 | 2.0 |
| (11)-1 | 45 | 30 | 8 | 17 | 0.18 | 53 | 12300 | 2.1 |
| (11)-2 | 29 | 30 | 16 | 25 | 0.55 | 45 | 11200 | 2.0 |
| (12)-1 | 51 | 33 | 12 | 4 | 0.24 | 63 | 13900 | 2.3 |
| (12)-2 | 41 | 32 | 22 | 5 | 0.54 | 63 | 14100 | 2.4 |

The structural formulae of Resins (1) to (12) are illustrated below:

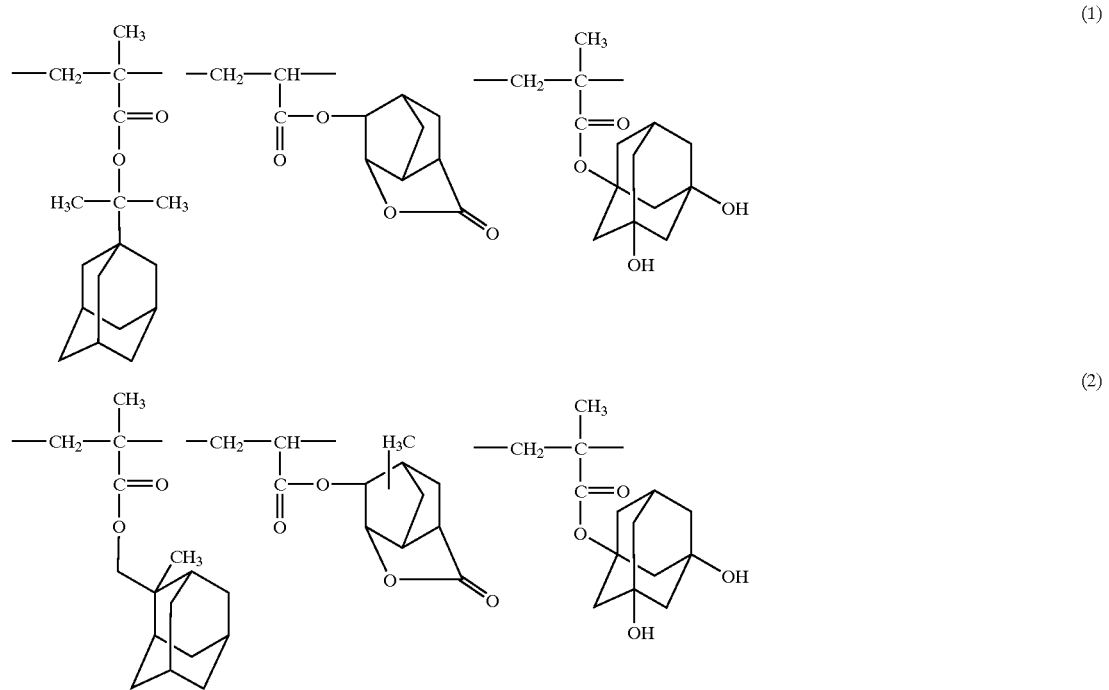

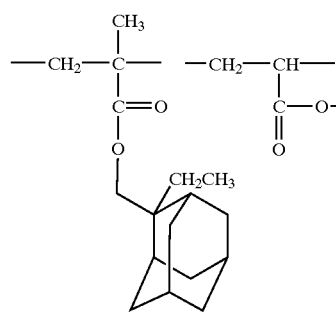 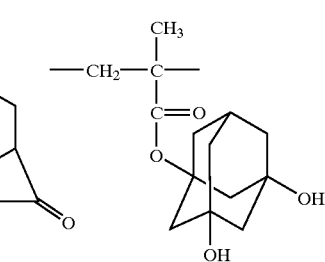 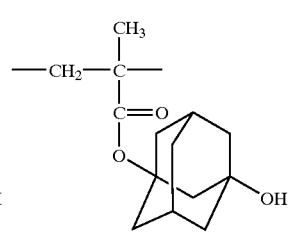 (3)
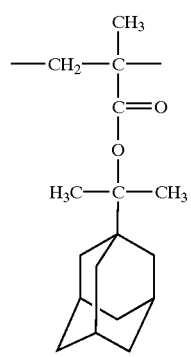 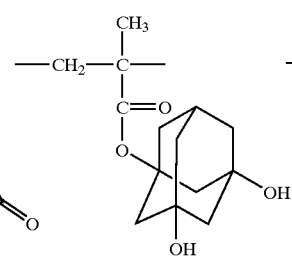 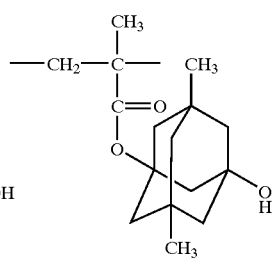 (4)
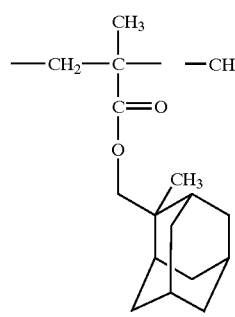 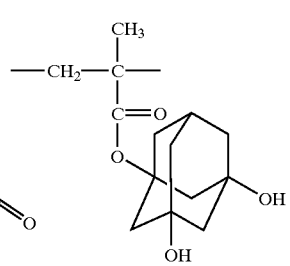 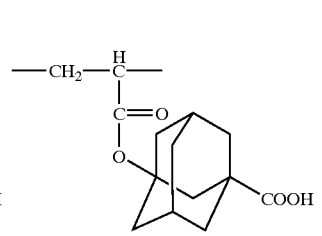 (5)
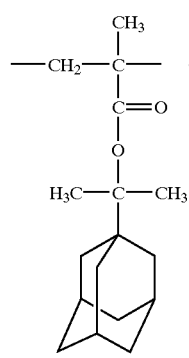 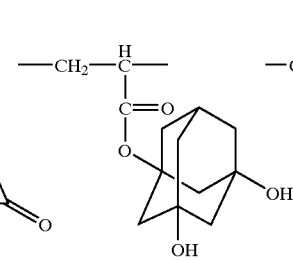 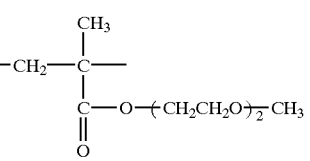 (6)

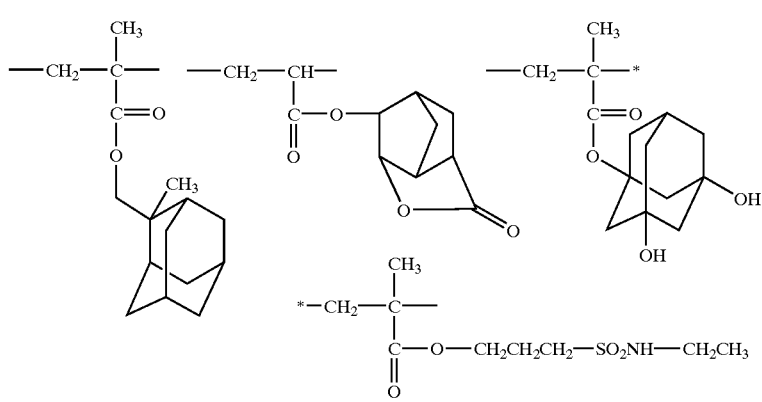
(7)
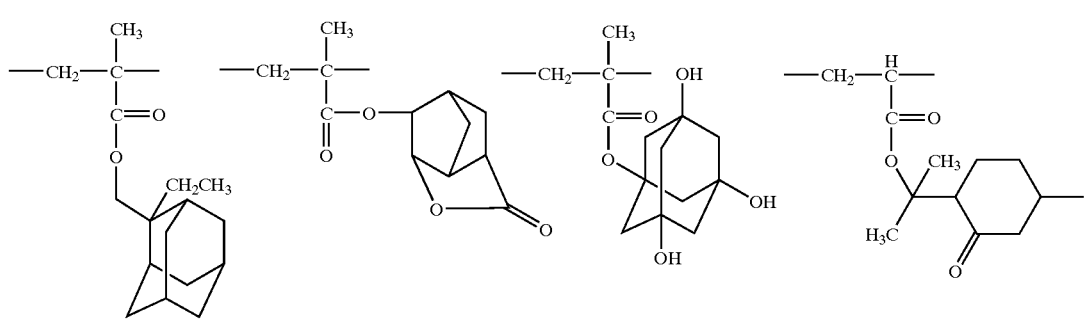
(8)
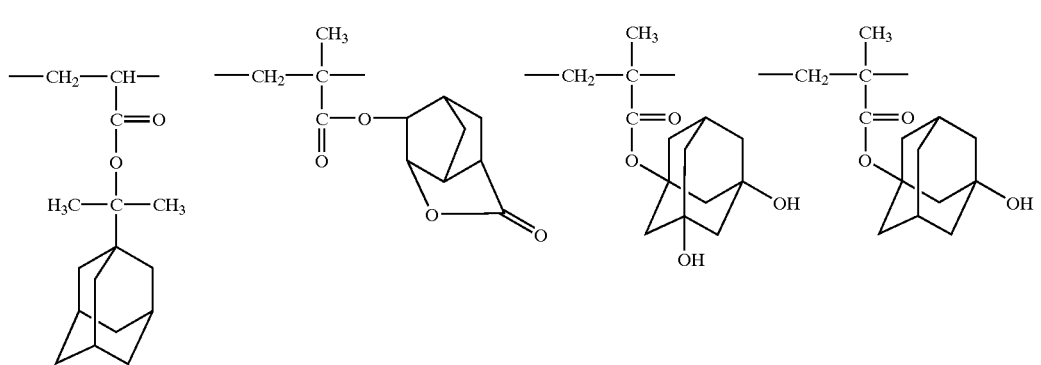
(9)
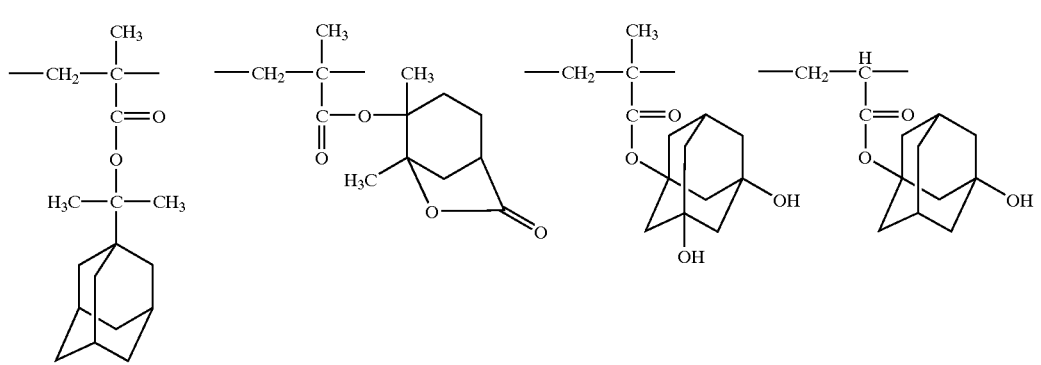
(10)

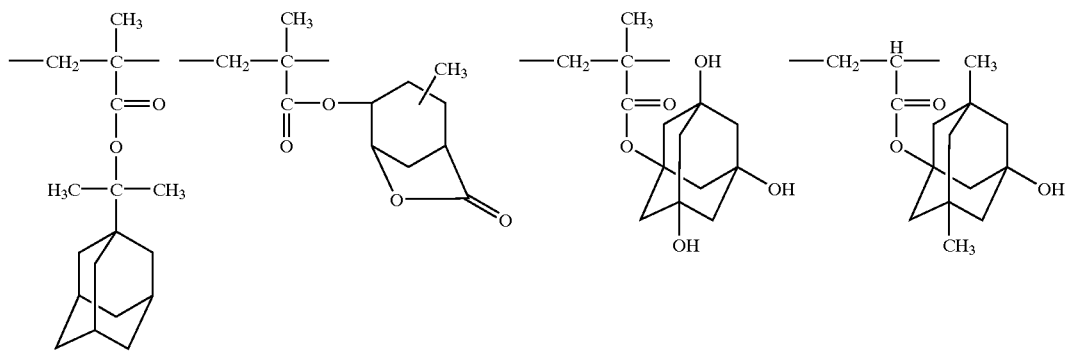

(11)

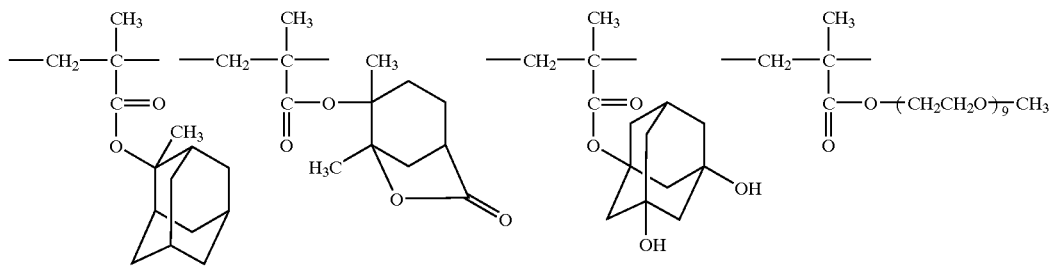

(12)

EXAMPLES 1 TO 27 AND COMPARATIVE EXAMPLES 1 AND 2

<Preparation and Evaluation of Positive Resist Composition>

The resins synthesized in Synthesis Examples (which are set forth in Table 2 also) were each weighed out in an amount of 2 g, and mixed with ingredients shown in Table 2, namely a photo-acid generator (in an amount specified in Table 2), 4 mg of an organic basic compound (amine) and, if desired, 10 mg of a surfactant. Each mixture was dissolved in a 70:30 mixture of PGMEA and ethyl lactate so that the resultant solution had a solids concentration of 14 weight %, and then filtered through a 0.1 μm microfilter. Thus, positive resist compositions of Examples 1 to 27 and Comparative Examples 1 and 2 were each prepared.

Additionally, the resin used in Comparative Examples 1 and 2 is Resin (20) disclosed in Japanese Patent Laid-Open 2001-109154. On the "basic compound" column of Table 2, the mixing ratio is designated in parentheses when different basic compounds are used as a mixture.

TABLE 2

| | Resin (2 g) | Photo-acid generator species, amount added | Basic compound (4 mg) | Surfactant (10 mg) |
|---|---|---|---|---|
| Example 1 | (1)-1 | PAG 4-36, 38 mg | 1 | W1 |
| Example 2 | (1)-2 | PAG 4-39, 39 mg | 3 | W2 |
| Example 3 | (1)-3 | PAG 4-48, 39 mg | 4 | W5 |
| Example 4 | (1)-4 | PAG 4-5, 40 mg | 3 | W5 |
| Example 5 | (1)-5 | PAG 4-48/4-96, 40/5 mg | 6 | W5 |
| Example 6 | (1)-6 | PAG 4-48/4-57, 38/15 mg | 4 | W5 |
| Example 7 | (2)-1 | PAG 4-52, 41 mg | 6 | W4 |
| Example 8 | (2)-2 | PAG 4-52/4-67, 35/10 mg | 5 | W5 |
| Example 9 | (2)-3 | PAG 4-52/4-65, 36/20 mg | 6 | W1 |
| Example 10 | (3)-1 | PAG 4-48/4-53, 20/30 mg | 5 | W5 |
| Example 11 | (3)-2 | PAG 4-45, 40 mg | 4 | W2 |
| Example 12 | (4)-1 | PAG 4-41, 41 mg | 6 | W5 |
| Example 13 | (4)-2 | PAG 4-52/4-95, 38/10 mg | 4 | W2 |
| Example 14 | (4)-3 | PAG 4-94, 42 mg | 6 | W5 |
| Example 15 | (5) | PAG 4-39/4-67, 20/35 mg | 2 | W5 |
| Example 16 | (6)-1 | PAG 4-6/4-80, 30/20 mg | 3 | W3 |
| Example 17 | (6)-2 | PAG 4-48, 43 mg | 6 | W1 |
| Example 18 | (7) | PAG 4-48/4-63, 18/36 mg | 4 | W3 |
| Example 19 | (8) | PAG 4-36/4-89, 20/35 mg | 5 | W2 |
| Example 20 | (9)-1 | PAG 4-17/4-78, 30/20 mg | 6 | W1 |
| Example 21 | (9)-2 | PAG 4-48/4-96, 30/12 mg | 4/5 (1/1) | W5 |
| Example 22 | (10)-1 | PAG 4-35/4-24, 32/5 mg | 3 | W1 |
| Example 23 | (10)-2 | PAG 4-6/4-65, 40/10 mg | 4/5 (2/1) | W5 |
| Example 24 | (11)-1 | PAG 4-41/7-3, 40/5 mg | 3 | W5 |
| Example 25 | (11)-2 | PAG 4-52/4-59, 43/3 mg | 6 | W5 |
| Example 26 | (12)-1 | PAG 4-39/6-27, 38/10 mg | 4 | W5 |
| Example 27 | (12)-2 | PAG 4-6/4-94, 40/5 mg | 4/5 (1/1) | W5 |
| Comparative Example 1 | Comparative resin* | PAG 4-5, 40 mg | 1 | — |
| Comparative Example 2 | ditto | PAG 4-5, 40 mg | 1 | W5 |

*Resin (20) disclosed in Japanese Patent Laid-Open 2001-109154

The following are compounds used as the surfactants:

W1: Megafac F176 (produced by Dainippon Ink & Chemicals, Inc.)
(a surfactant containing fluorine atoms)

W2: Megafac R08 (produced by Dainippon Ink & Chemicals, Inc.)
(a surfactant containing fluorine and silicon atoms)

W3: Polysiloxane polymer KP-341 (produced by Shin-Etsu Chemical Industry Co., Ltd.)

W4: Polyoxyethylene nonyl phenyl ether

W5: Troysol S-366 (produced by Troy Chemical Industries, Inc.)

The numbers 1 to 6 stand for the following amine compounds, respectively:

1: 1,5-Diazabicyclo[4.3.0]-5-nonene (DBN)
2: Bis(1,2,2,6,6-pentamethyl-4-piperidyl)sebacate
3: Trioctylamine
4: Triphenylimidazole
5: Antipyrine
6: 2,6-Diisopropylaniline <Testing for Evaluation>

DUV30J produced by Brewer Science Inc. was coated in a thickness of 160 nm on a silicon wafer by use of a spin coater, and then dried. On this coating, each of the solutions of positive resist compositions set forth above was further coated, and dried at 130° C. for 90 seconds. Thus, a photoresist film having a thickness of about 0.4 $\mu$m was formed. The photoresist film was exposed to ArF excimer laser (an ArF stepper with a wavelength of 193 nm and NA=0.6, made by Ultra tech Stepper, Inc.). After the exposure, the photoresist film was heated at 120° C. for 90 seconds, developed with a 2.38% aqueous solution of tetramethylammoniumhydroxide, and rinsed with distilled water. Thus, a resist pattern profile was obtained.

The resist patterns thus formed on the silicon wafer were observed under a scanning electron microscope (SEM), and thereby the following resist-performance characteristics were evaluated.

[Pattern Topple]

The amount of exposure required for reproducing a mask pattern of 0.13 $\mu$m (L/S=1/1) is taken as E1. The focus is changed by ±0.4 $\mu$m on the overexposure side, and the patterns formed under such a condition are examined under SEM as to whether or not a pattern topple is caused therein. And the amount of exposure causing a pattern topple is taken as E2. Herein, (E2–E1)×100/E1 (%) is adopted as an indicator of the pattern topple. The greater this value, the better the pattern topple inhibiting capability. In other words, the smaller the value, the poorer the inhibiting capability.

[Surface Roughening upon Etching]

Contact hole patterns of 0.15 $\mu$m are etched for 60 seconds with $CHF_3/O_2$=8/2 plasma or $CF_3/O_2$=13/6 plasma, and the cross-section and the surface of a sample obtained are observed under SEM. When pin-hole defects are caused (through etching of the layer under the area intended not to be processed), the surface roughening is rated unacceptable (x). When the surface is roughened and defects are not caused, but holes are deformed, the sample is rated poor (Δ) in tolerance to the surface roughening. When the surface is slightly roughened and no holes are deformed, the sample is rated good (○) in tolerance to the surface roughening.

These evaluation results are shown in Table 3.

[Line Edge Roughness]

The 130 nm (line/space=1/1) line pattern of a mask is reproduced on a sample by the minimum amount of exposure, and the edge of the reproduced line pattern within the range of 5 $\mu$m in the direction of the length is examined for distance from the base line on which the edge should be present. Therein, the distance is determined at 50 points each by means of S-9220 made by Hitachi Ltd., and therefrom the standard deviation is calculated. Further, 3σ is determined. The smaller value thereof means the better resist performance.

[Pitch Dependency]

The line-width variation rate of a 150 nm isolated-line pattern formed under the exposure enabling the reproduction of a 130 nm mask pattern (pitch 1/1) is determined.

The evaluation results obtained are also shown in Table 3.

TABLE 3

| | Pattern topple (%) | Tolerance to surface roughening upon etching ($CHF_3/O_2$ = 8/2) | Tolerance to surface roughening upon etching ($CHF_3/O_2$ = 13/2) | Edge roughness (nm) | Pitch dependency (%) |
|---|---|---|---|---|---|
| Example 1 | 5 | ○ | Δ | 9 | 13 |
| Example 2 | 4 | Δ | Δ | 10 | 15 |
| Example 3 | 5 | ○ | Δ | 9 | 13 |
| Example 4 | 5 | ○ | Δ | 9 | 13 |
| Example 5 | 8 | ○ | ○ | 6 | 9 |
| Example 6 | 9 | ○ | ○ | 5 | 7 |
| Example 7 | 4 | ○ | Δ | 10 | 15 |
| Example 8 | 8 | ○ | ○ | 6 | 10 |
| Example 9 | 9 | ○ | ○ | 5 | 9 |
| Example 10 | 5 | ○ | Δ | 9 | 12 |
| Example 11 | 8 | ○ | ○ | 6 | 8 |
| Example 12 | 4 | ○ | Δ | 10 | 14 |
| Example 13 | 8 | ○ | ○ | 6 | 9 |
| Example 14 | 5 | ○ | Δ | 9 | 13 |
| Example 15 | 6 | ○ | Δ | 8 | 13 |
| Example 16 | 4 | ○ | Δ | 10 | 15 |
| Example 17 | 9 | ○ | ○ | 5 | 8 |
| Example 18 | 4 | ○ | Δ | 10 | 16 |
| Example 19 | 4 | Δ | Δ | 10 | 15 |
| Example 20 | 6 | ○ | Δ | 8 | 12 |
| Example 21 | 9 | ○ | ○ | 5 | 7 |
| Example 22 | 5 | ○ | Δ | 9 | 13 |
| Example 23 | 8 | ○ | ○ | 6 | 9 |
| Example 24 | 4 | Δ | Δ | 10 | 15 |
| Example 25 | 9 | ○ | ○ | 5 | 7 |
| Example 26 | 5 | ○ | Δ | 9 | 14 |
| Example 27 | 9 | ○ | ○ | 5 | 8 |
| Comparative Example 1 | 1 | x | x | 15 | 35 |
| Comparative Example 2 | 1 | x | x | 14 | 30 |

As can be seen from the data shown in Table 3, the present positive resist compositions are superior in prevention of pattern topple, tolerance to surface roughening upon etching, line edge roughness and pitch dependency.

Positive resist compositions according to the invention are prevented from suffering pattern topple and surface roughening at the time of etching, and satisfactory in line edge roughness and pitch dependency. Therefore, they can be used suitably for photolithography using ArF excimer laser and other far ultraviolet rays.

In the present invention, particularly, when, as the resin (A), the present positive resist composition comprises acid-decomposable resin (A) including: the repeating unit (A1)

having at least one of a dihydroxyadamantyl group and a trihydroxyadamantyl group; the repeating unit (A2) containing an acid-decomposable group having an alicyclic structure; and the repeating unit (A3) having an alicyclic lactone structure, the effect of the present invention is more remarkable.

The entire disclosure of each and every foreign patent application from which the benefit of foreign priority has been claimed in the present application is incorporated herein by reference, as if fully set forth.

What is claimed is:

1. A positive resist composition comprising:

(A) a resin capable of increasing the solubility in an alkali developer by the action of acid, in which the resin contains (A1) a repeating unit having at least one of a dihydroxyadamantyl group and a trihydroxyadamantyl group, (A2) a repeating unit containing an acid-decomposable group having an alicyclic structure, and (A3) a repeating unit having an alicyclic lactone structure;

(B) a compound capable of generating an acid upon irradiation with one of an actinic ray and a radiation; and (C) a surfactant containing at least one of a fluorine atom and a silicon atom, wherein the resin (A) contains the repeating unit (A1) and the repeating unit (A2) at a composition molar ratio: A1/A2 of from 0.35 to 1.0, and a total content of the repeating unit (A1) and the repeating unit (A2) in the resin (A) is 40 to 70 mole %, and the repeating unit (A3) is a repeating unit containing a group represented by any of formulae (V-1), (V-2) and (V-4):

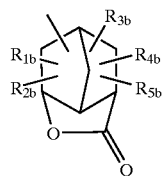
(V-1)

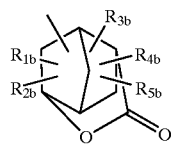
(V-2)

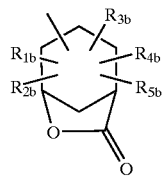
(V-3)

wherein $R_{1b}$ to $R_{5b}$ each independently represents a hydrogen atom or an alkyl, cycloalkyl or alkenyl group, which may be substituted; and any two of $R_{1b}$ to $R_{5b}$ may combine with each other to form a ring.

2. The positive resist composition as described in claim 1, wherein the composition molar ratio: A1/A2 is from 0.4 to 0.8 and the total content of the repeating unit (A1) and the repeating unit (A2) in the resin (A) is 45 to 65 mole %.

3. The positive resist composition as described in claim 1, wherein the repeating unit (A1) is a repeating unit represented by formula (I):

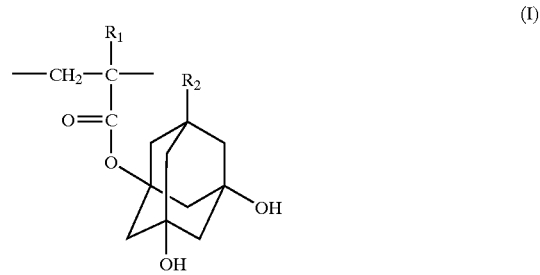
(I)

wherein $R_1$ represents a hydrogen atom, an alkyl group, a halogen atom or a cyano group, and $R_2$ represents a hydrogen atom or a hydroxyl group.

4. The positive resist composition as described in claim 1, wherein the repeating unit (A2) is a repeating unit having a partial structure represented by any of formulae (pI) to (pVI):

(pI)

(pII)

(pIII)

(pIV)

(pV)

(pVI)

wherein $R_{11}$ represents a methyl group, an ethyl group, a n-propyl group, an isopropyl group, a n-butyl group, an isobutyl group or a sec-butyl group; Z represents an atom group forming an alicyclic hydrocarbon group together with the carbon atom; $R_{12}$ to $R_{16}$ each independently represent a linear or branched alkyl group having 1 to 4 carbon atoms or an alicyclic hydrocarbon group, provided that at least one of $R_{12}$, $R_{13}$ and $R_{14}$ is an alicyclic hydrocarbon group and either $R_{15}$ or $R_{16}$ is an alicyclic hydrocarbon group; $R_{17}$ to $R_{21}$ each independently represent a hydrogen atom, a linear or branched alkyl group having 1 to 4 carbon atoms or an alicyclic hydrocarbon group, provided that at least one of $R_{17}$ to $R_{21}$ is an alicyclic hydrocarbon group and either $R_{19}$ or $R_{21}$ is a linear or branched alkyl group having 1 to 4 carbon atoms or an alicyclic hydrocarbon group; $R_{22}$ to $R_{25}$ independently represent a linear or branched alkyl group having 1 to 4 carbon atoms or an alicyclic hydrocarbon group, provided that at least one of $R_{22}$ to $R_{25}$ is an alicyclic hydrocarbon group, and $R_{23}$ and $R_{24}$ may combine with each other to form a ring.

5. The positive resist composition as described in claim 1, wherein the repeating unit (A2) is a repeating unit represented by formula (pA):

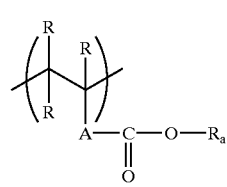

(pA)

wherein each R represents a hydrogen atom, a halogen atom or a linear or branched alkyl group having 1 to 4 carbon atoms, which may be substituted or unsubstituted; the three R groups may be the same or different; A represents a single bond, or a single group or a combination of at least two groups selected from the group consisting of an unsubstituted alkylene group, a substituted alkylene group, an ether group, a thioether group, a carbonyl group, an ester group, an amido group, a sulfonamido group, a urethane group and a urea group; and Ra represents a group represented by any of formulae (pI) to (pVI):

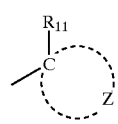

(pI)

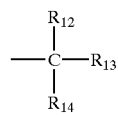

(pII)

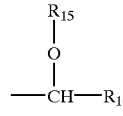

(pIII)

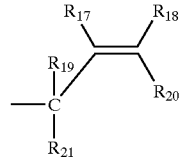

(pIV)

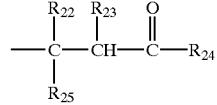

(pV)

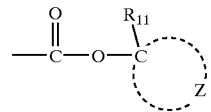

(pVI)

wherein $R_{11}$ represents a methyl group, an ethyl group, a n-propyl group, an isopropyl group, a n-butyl group, an isobutyl group or a sec-butyl group; Z represents an atom group forming an alicyclic hydrocarbon group together with the carbon atom; $R_{12}$ to $R_{16}$ each independently represent a linear or branched alkyl group having 1 to 4 carbon atoms or an alicyclic hydrocarbon group, provided that at least one of $R_{12}$, $R_{13}$ and $R_{14}$ is an alicyclic hydrocarbon group and either $R_{15}$ or $R_{16}$ is an alicyclic hydrocarbon group; $R_{17}$ to $R_{21}$ each independently represent a hydrogen atom, a linear or branched alkyl group having 1 to 4 carbon atoms or an alicyclic hydrocarbon group, provided that at least one of $R_{17}$ to $R_{21}$ is an alicyclic hydrocarbon group and either $R_{19}$ or $R_{21}$ is a linear or branched alkyl group having 1 to 4 carbon atoms or an alicyclic hydrocarbon group; $R_{22}$ to $R_{25}$ independently represent a linear or branched alkyl group having 1 to 4 carbon atoms or an alicyclic hydrocarbon group, provided that at least one of $R_{22}$ to $R_{25}$ is an alicyclic hydrocarbon group, and $R_{23}$ and $R_{24}$ may combine with each other to form a ring.

6. The positive resist composition as described in claim 1, wherein the repeating unit (A3) is a repeating unit represented by formula (A1):

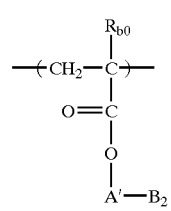

(AI)

wherein $R_{b0}$ represents a hydrogen atom, a halogen atom, or a substituted or unsubstituted alkyl group having 1 to 4 carbon atoms; A' represents a single bond, an ether group, an ester group, a carbonyl group, an alkylene group or a divalent group formed by combining at least two of these groups; $B_2$ represents a group represented by any of the formulae (V-1), (V-2) and (V-4):

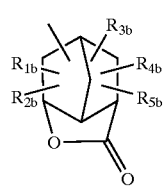

(V-1)

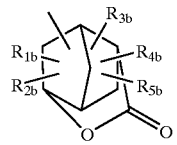

(V-2)

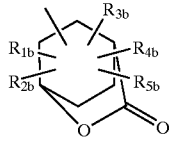

(V-4)

wherein $R_{1b}$ to $R_{5b}$ each independently represent a hydrogen atom or an alkyl, cycloalkyl or alkenyl group, which may be substituted; and any two of $R_{1b}$ to $R_{5b}$ may combine with each other to form a ring.

7. The positive resist composition as described in claim 3, wherein the resin (A) contains the repeating unit (A1) in an amount of from 5 to 30 mole % based on the total repeating units.

8. The positive resist composition as described in claim 4, wherein the resin (A) contains the repeating unit (A2) in an amount of from 24 to 55 mole % based on the total repeating units.

9. The positive resist composition as described in claim 1, wherein the resin (A) contains the repeating unit (A3) in an amount of from 5 to 65 mole %, based on the total repeating units.

10. The positive resist composition as described in claim 1, wherein the resin (A) contains the repeating unit (A3) in an amount of from 10 to 60 mole %, based on the total repeating units.

11. The positive resist composition as described in claim 1, wherein the resin (A) contains the repeating unit (A3) in an amount of from 15 to 55 mole %, based on the total repeating units.

12. The positive resist composition as described in claim 1, which comprises the resin (A) in amount of 40 to 99.99 wt %, based on the total solid content in the positive resist composition.

13. The positive resist composition as described in claim 1, which comprises the compound (B) in amount of 0.01 to 30 wt %, based on the total solid content in the positive resist composition.

14. The positive resist composition as described in claim 1, which further comprises (D) an organic basic compound.

15. The positive resist composition as described in claim 1, wherein the repeating unit (A3) is a repeating unit containing a group represented by the formula (V-1).

* * * * *